(12) United States Patent
Kawakami et al.

(10) Patent No.: US 7,274,044 B2
(45) Date of Patent: Sep. 25, 2007

(54) LIGHT EMITTING DEVICE

(75) Inventors: Takahiro Kawakami, Kanagawa (JP);
Kaoru Tsuchiya, Kanagawa (JP);
Takeshi Nishi, Kanagawa (JP);
Yoshiharu Hirakata, Kanagawa (JP);
Keiko Kida, Kanagawa (JP); Ayumi Sato, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 15 days.

(21) Appl. No.: 11/041,530

(22) Filed: Jan. 25, 2005

(65) Prior Publication Data

US 2005/0179372 A1    Aug. 18, 2005

(30) Foreign Application Priority Data

Jan. 26, 2004    (JP)    ............................ 2004-017534

(51) Int. Cl.
*H01L 33/00*    (2006.01)

(52) U.S. Cl. .................. 257/98; 257/79; 257/E33.072; 257/E33.073

(58) Field of Classification Search .................. 257/79, 257/98, E33.072, E33.073
See application file for complete search history.

(56) References Cited

U.S. PATENT DOCUMENTS

| | | | |
|---|---|---|---|
| 5,897,328 A | 4/1999 | Yamauchi et al. | |
| 5,986,729 A | 11/1999 | Yamanaka et al. | |
| 6,448,580 B1 | 9/2002 | Arai et al. | |
| 6,734,463 B2 | 5/2004 | Ishikawa | |
| 6,760,004 B2 | 7/2004 | Koyama | |
| 6,798,442 B1 | 9/2004 | Kim et al. | |
| 6,861,710 B2 | 3/2005 | Murakami et al. | |
| 6,903,377 B2* | 6/2005 | Yamazaki et al. | ............ 257/88 |
| 6,958,252 B2 | 10/2005 | Kim | |
| 2002/0047120 A1 | 4/2002 | Inukai | |
| 2002/0140643 A1* | 10/2002 | Sato | ............................ 345/76 |
| 2003/0089991 A1* | 5/2003 | Yamazaki et al. | .......... 257/759 |
| 2003/0116768 A1 | 6/2003 | Ishikawa | |
| 2003/0129790 A1* | 7/2003 | Yamazaki et al. | .......... 438/149 |
| 2003/0206332 A1 | 11/2003 | Yamazaki et al. | |
| 2004/0188692 A1 | 9/2004 | Ishikawa | |
| 2005/0145861 A1 | 7/2005 | Kawakami et al. | |
| 2005/0161680 A1 | 7/2005 | Kawakami et al. | |
| 2005/0179372 A1 | 8/2005 | Kawakami et al. | |

FOREIGN PATENT DOCUMENTS

| | | |
|---|---|---|
| GB | 2 286 081 | 8/1995 |
| JP | 7-211458 | 8/1995 |
| JP | 8-330600 | 12/1996 |
| JP | 10-254383 | 9/1998 |
| JP | 10-289784 | 10/1998 |
| JP | 2000-162647 | 6/2000 |
| JP | 2002-287666 | 10/2002 |
| JP | 3608613 | 10/2004 |

* cited by examiner

*Primary Examiner*—Andy Huynh
(74) *Attorney, Agent, or Firm*—Nixon Peabody LLP; Jeffrey L. Costellia

(57) ABSTRACT

It is an object of the present invention to provide an active matrix light emitting device which can efficiently prevent a diffusion of impurities from a substrate to a transistor, as well as reducing a reflection of light in a process of extracting light toward the outside of the light emitting device. One feature of the present invention is a light emitting device including a substrate, a first insulating layer provided over the substrate, a transistor provided over the first insulating layer, and a second insulating layer having a first opening portion which is provided to expose the substrate as well as covering the transistor, wherein a light emitting element is provided inside the first opening portion.

25 Claims, 15 Drawing Sheets

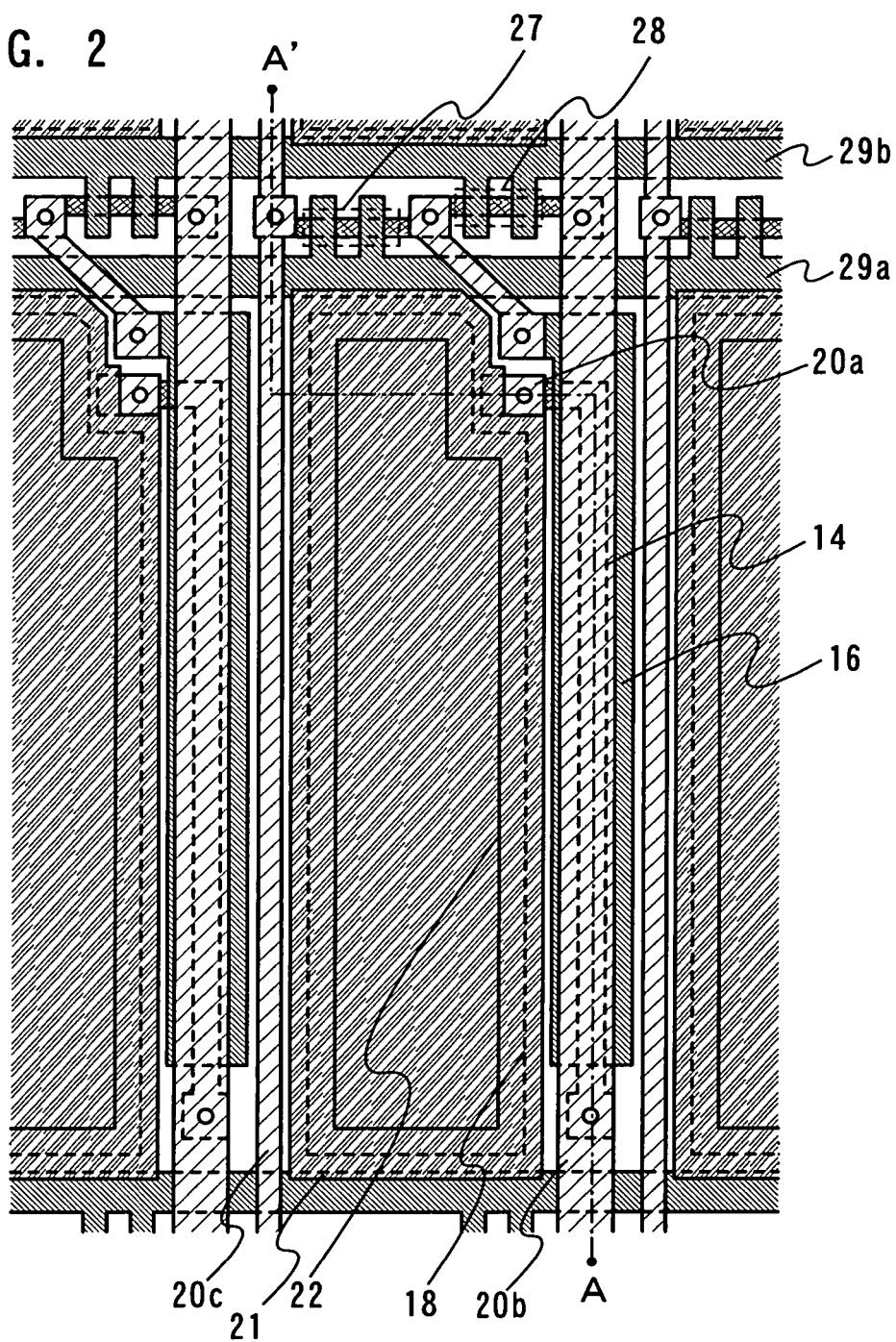

LIGHT EMITTING DEVICE

BACKGROUND OF THE INVENTION

1. Field of the Invention

The present invention relates to an active matrix light emitting device. More specifically, the invention relates to a structure of a part from which light is extracted.

2. Description of the Related Art

A light emitting device utilizing light from an electroluminescent element (a light emitting element) attracts attention as a low power consumption display device having a wide viewing angle.

There are an active matrix type and a passive matrix type as driving methods for a light emitting device mainly used for display. In an active matrix light emitting device, an emission state, a non-emission state or the like of every light emitting element can be controlled. Therefore, an active matrix light emitting device can be driven with lower power consumption than that of a passive matrix light emitting device, and it is suitable for being mounted not only as a display portion of a small electric appliance such as a cellular phone but also as a display portion of a large-size television receiver or the like.

In an active matrix light emitting device, each light emitting element is provided with a transistor for controlling the drive of the respective light emitting element. The transistor and the light emitting element each are placed over a substrate so that the extraction of light toward the outside is not prevented by the transistor (for example, refer to Patent Document 1: Japanese Patent Application No. Hei08-330600 and Patent Document 2: Japanese Patent Application No. Hei10-254383). The light emitting element has a structure in which a light emitting layer is interposed between a pair of electrodes, and light is generated in the light emitting layer. Here, an emission state and a non-emission state of the light emitting element are controlled by a signal from the transistor.

Light is extracted toward the outside through a transparent electrode formed from indium tin oxide (ITO) and a substrate formed from quartz, like a light emitting device in Patent Documents 1 and 2. At this time, refractive indexes of ITO, quartz, and a substance which constitutes a light emitting layer are different with each other; therefore, a part of light is reflected in the interface between the light emitting layer and the transparent electrode and in the interface between the transparent electrode and the substrate. Due to such reflection of light, light extraction efficiency toward the outside of the light emitting device is reduced.

Moreover, in recent years, an active matrix light emitting device using a substrate formed from not quartz but glass or plastic has been developed to make a light emitting device lightweight or the like. However, a substrate formed from glass includes impurities such as an alkali metal and the like. In addition, when impurities of an alkali metal and the like are attached to a substrate formed from plastic, the substrate formed from plastic easily diffuses impurities. It is concerned that a transistor does not work normally if the impurities are mixed into the transistor. Therefore, an insulating layer for preventing the diffusion of impurities is provided between the substrate and the transistor. However, in the case where the insulating layer for preventing the diffusion of impurities is provided, it is concerned that light is reflected in the interface between the insulating layer and a transparent electrode or in the interface between the insulating layer and the substrate, and thus, light extraction efficiency is reduced as described above.

SUMMARY OF THE INVENTION

It is an object of the present invention to provide an active matrix light emitting device which reduces a reflection of light in a process of extracting light toward the outside of the light emitting device and which can sufficiently prevent the diffusion of impurities from a substrate to a transistor.

One feature of the present invention is a light emitting device including a substrate, a first insulating layer provided over the substrate, a transistor provided over the first insulating layer, and a light emitting element provided over the first insulating layer in an opening portion of a second insulating layer which covers the transistor, wherein the first insulating layer can prevent the diffusion of impurities and has a refractive index which is smaller than that of the first electrode and a refractive index which is larger than that of the substrate.

One feature of the present invention is a light emitting device including a substrate, a first insulating layer provided over the substrate, a transistor provided over the first insulating layer, a second insulating layer having a first opening portion which is provided to expose the first insulating layer as well as covering the transistor, a first electrode provided to be overlapped with the first insulating layer in the first opening portion, a bank layer having a second opening portion which is provided to expose the first electrode as well as covering the second insulating layer, a light emitting layer provided to be overlapped with the first electrode in the second opening portion, and a second electrode provided to be overlapped with the light emitting layer in the second opening portion, wherein the first insulating layer can prevent the diffusion of impurities and has a refractive index which is smaller than that of the first electrode and a refractive index which is larger than that of the substrate.

Here, the first insulating layer is preferably formed from silicon nitride containing oxygen, and particularly, more preferably, silicon nitride containing an oxygen element of from 5% to 6% when Rutherford Back Scattering/Hydrogen Forward Scattering (RBS/HFS) analysis is performed.

The first electrode, the second electrode, and the light emitting layer interposed between the foregoing electrodes constitute a light emitting element. Moreover, the transistor is provided to drive the light emitting element and is electrically connected to the first electrode through a connection portion.

Further, an insulating layer having smaller stress difference than that of a semiconductor layer which is a component of the transistor may be provided between the first insulating layer and the transistor. Such the insulating layer is preferably formed, for example, from silicon oxide.

Moreover, in a light emitting device of the present invention, an insulating layer having a refractive index which is smaller than that of the first electrode and which is equal to or smaller than that of the first insulating layer may be provided between the first insulating layer and the first electrode. The insulating layer is preferably formed from silicon nitride containing oxygen. Moreover, in the case where the second insulating layer is formed from a substance having high moisture permeability, a side wall of the second insulating layer is preferably covered with an insulating layer formed from silicon nitride containing oxygen in the second opening portion.

According to the present invention, a light emitting device which reduces the reflection of light in a process in which light is extracted toward the outside of the light emitting device and which can sufficiently prevent the diffusion of impurities from a substrate to a transistor can be obtained.

Moreover, according to the present invention, a light emitting device in which a variation of an emission spectrum depending on an angle of viewing a light extraction surface is reduced; and therefore, an image having favorable visibility can be obtained.

These and other objects, features and advantages of the present invention will become more apparent upon reading of the following detailed description along with the accompanied drawings.

BRIEF DESCRIPTION OF THE DRAWINGS

FIG. 2 is an explanatory top view of the structure of a light emitting device according to the present invention;

DETAILED DESCRIPTION OF THE INVENTION

Figure 1:
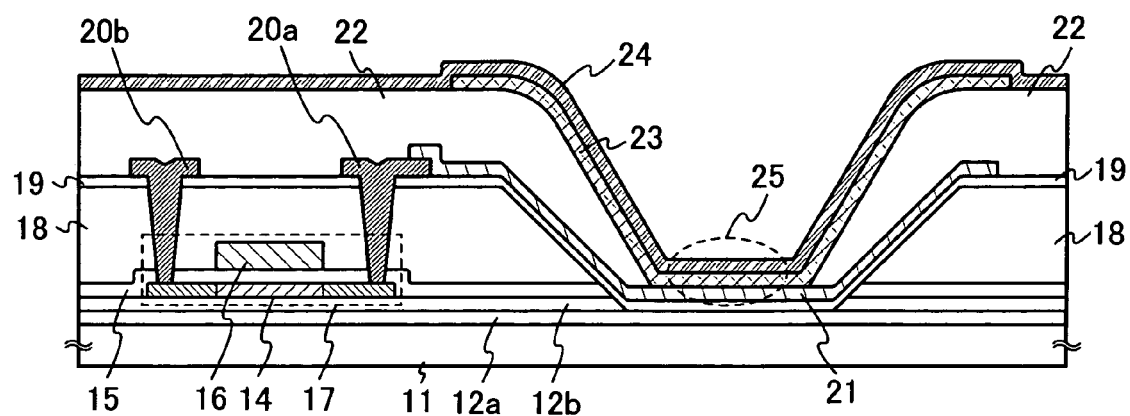
FIG. 1 is an explanatory cross-sectional view of the structure of a light emitting device according to the present invention.
Figure 3A:
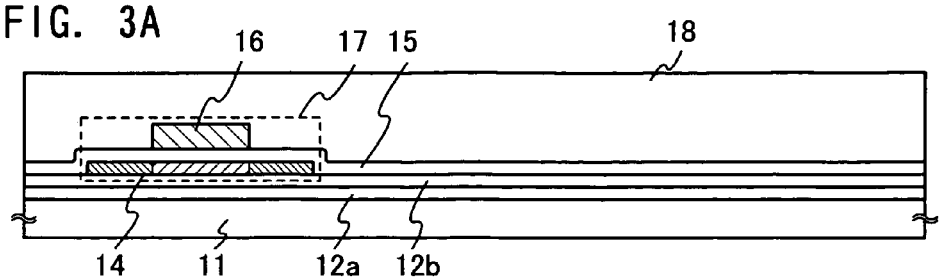
FIGS. 3A to 3E are explanatory views of a method for manufacturing a light emitting device according to the present invention.
Figure 3B:
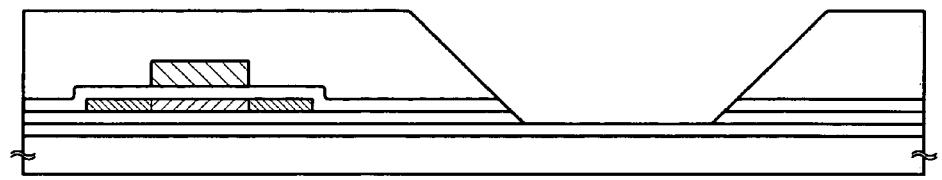
Figure 3C:
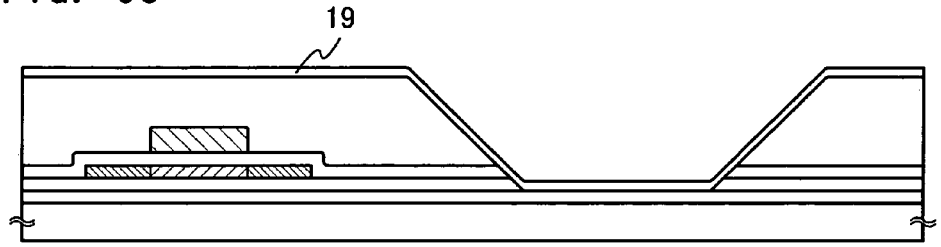
Figure 3D:
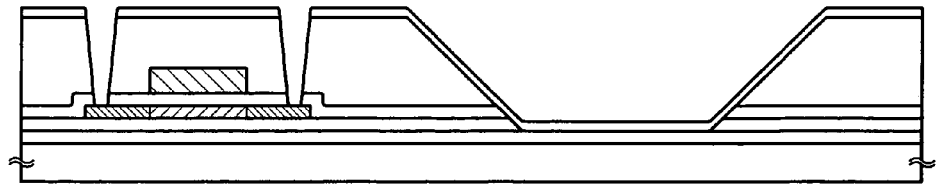
Figure 3E:
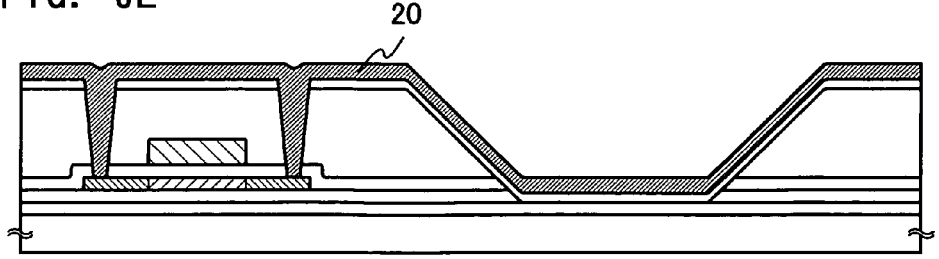
Figure 4A:
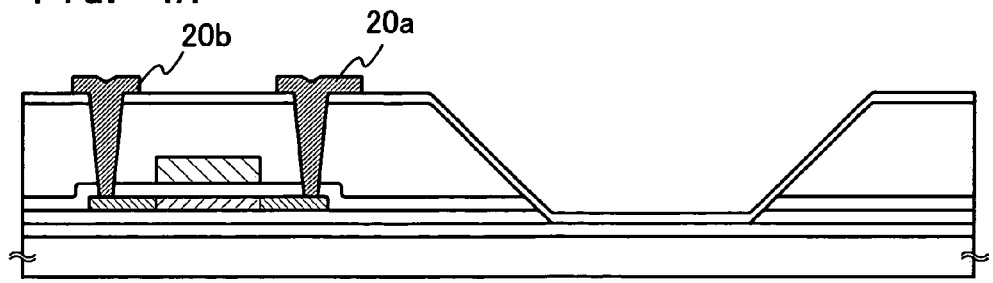
FIGS. 4A to 4D are explanatory views of a method for manufacturing a light emitting device according to the present invention.
Figure 4B:
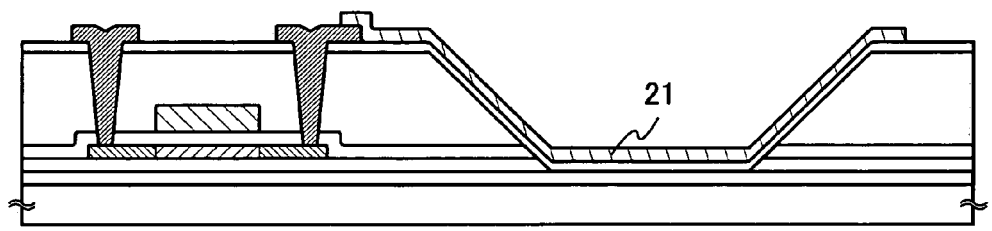
Figure 4C:
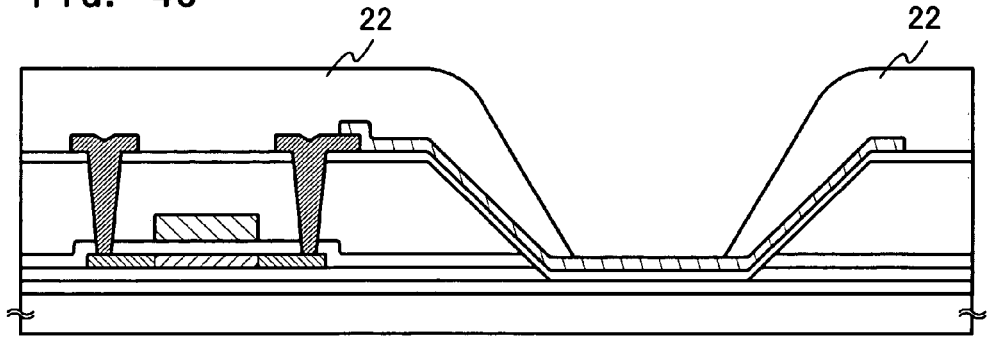
Figure 4D:
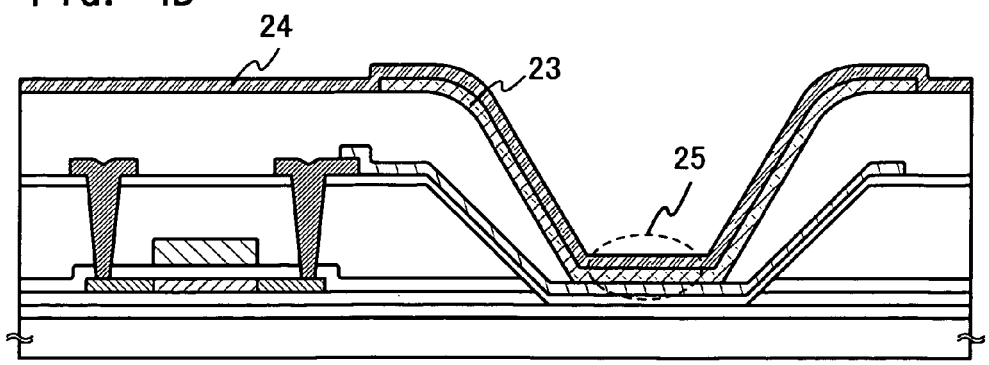
Figure 5A:
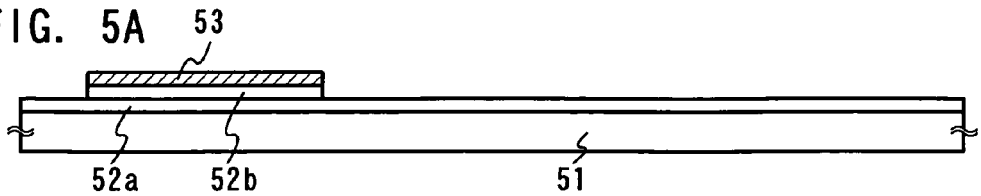
FIGS. 5A to 5E are explanatory views of a method for manufacturing a light emitting device according to the present invention.
Figure 5B:
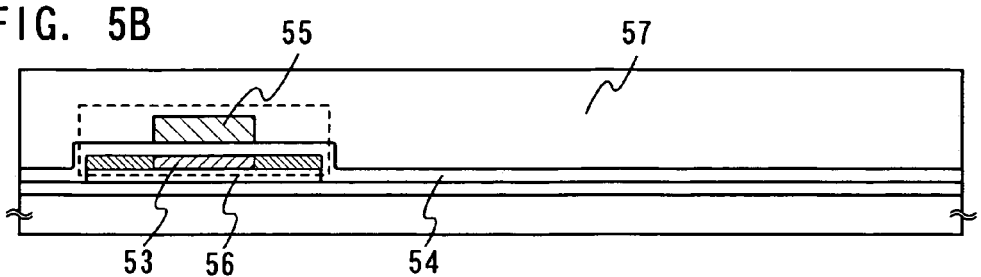
Figure 5C:
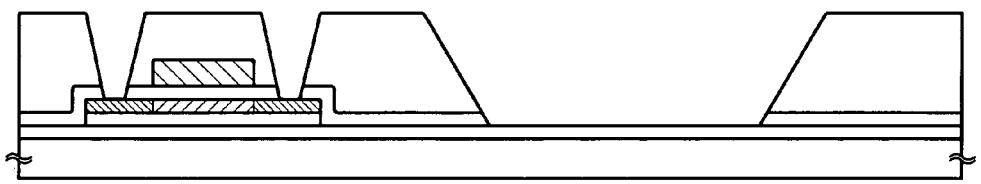
Figure 5D:
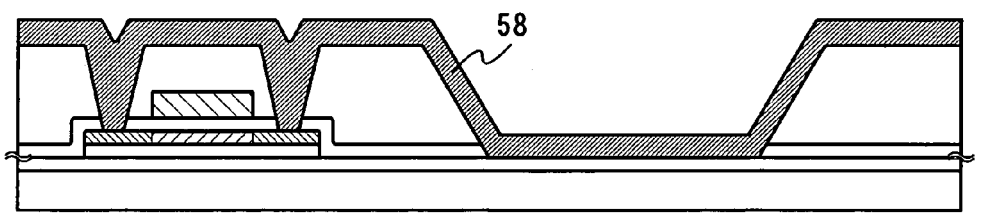
Figure 5E:
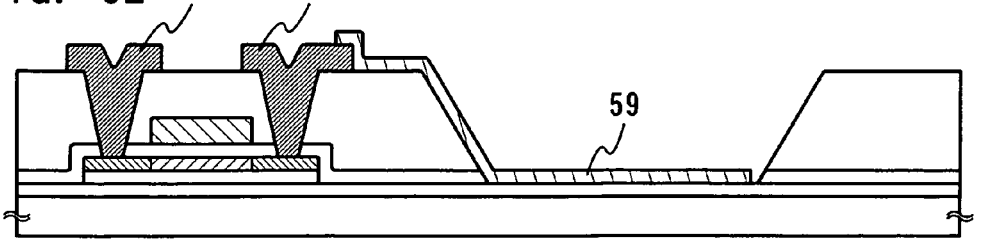

Hereinafter, one mode of the present invention is described with reference to the drawings. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the present invention.

EMBODIMENT MODE 1

A light emitting device according to the present invention is described with reference to FIG. 1.

An insulating layer 12 constituted by two layers of an insulating layer 12a and an insulating layer 12b is provided over a substrate 11. A staggered transistor 17 including a semiconductor layer 14, a gate insulating layer 15 and a gate electrode 16 is provided over the insulating layer 12b.

The transistor 17 is covered with an insulating layer 18 having a first opening portion. The first opening portion penetrates the gate insulating layer 15 and the insulating layer 12b to reach the insulating layer 12a. Therefore, in the first opening portion, a part of the insulating layer 12a is exposed.

The insulating layer 18 and the first opening portion are covered with an insulating layer 19, and the insulating layer 19 and the insulating layer 12a are overlapped with each other inside the first opening portion.

A light emitting element 25 is constituted by a first electrode 21, a second electrode 24, and a light emitting layer 23 interposed between these electrodes, and is provided over the insulating layer 19. The first electrode 21 is overlapped with the insulating layer 19.

The transistor 17 is electrically connected to the light emitting element 25 through a connection portion 20a formed from a conductive substance. Further, the connection portion 20a is provided over the insulating layer 19 to reach the semiconductor layer 14 through a contact hole which penetrates the insulating layers 18 and 19. Moreover, the connection portion 20a is electrically connected to the first electrode 21 by being partly in contact with the first electrode 21.

The connection portion 20a, a wiring 20b, the insulating layer 19, and the like are covered with a bank layer 22 having a second opening portion which is provided to expose a part of the first electrode 21. In the second opening portion, the light emitting layer 23 is provided over the first electrode 21, and the second electrode 24 is provided over the light emitting layer 23. The part in which the first electrode 21, the light emitting layer 23 and the second electrode 24 are stacked serves as the light emitting element 25. Note that the light emitting layer 23 contains a light emitting substance and is a layer constituted by a single layer or a multilayer.

In this embodiment mode, the substrate 11 is formed from a material transparent to light such as glass. Moreover, resin having flexibility such as plastic may be used for the substrate 11. In addition, a material which has a light-transmitting property and serves as a support body for supporting the transistor 17 and the light emitting element 25 can be used for the substrate 11.

The insulating layers 12a and 12b are formed from a substance which can prevent the diffusion of impurities from the substrate 11. Especially, the insulating layer 12a is preferably formed from a substance having a refractive index which is larger than that of the substrate 11 and a refractive index which is smaller than that of the first electrode 21 as well as having a function of preventing the diffusion of impurities. Silicon nitride having oxygen can be given as such a substance. On the other hand, the insulating layer 12b is preferably a layer having stress difference hardly different from that of the semiconductor layer 14, as well as having a function of preventing the diffusion of impurities. For example, a layer formed from silicon oxide can be given as such a layer. Further, nitrogen of a few percentages or less may be contained in the layer formed from silicon oxide. In addition, the insulating layer 12b is not required to be provided between the semiconductor layer 14 and the insulating layer 12a in the case where the diffusion of impurities from the substrate 11 can be prevented only by the insulating layer 12a.

The insulating layer 19 is preferably formed from a substance having low moisture permeability, a refractive index which is larger than that of the substrate 11, and a refractive index which is smaller than that of the first electrode 21. Moreover, the insulating layer 12a is preferably formed to have a refractive index which is equal to or smaller than that of the insulating layer 19. Further, the insulating layers 12a and 19 may be formd from the same substance.

The first electrode 21 may be formed by using a conductive material, which can transmit visible light, such as ITO (Indium Tin Oxide), ITO including silicon oxide, IZO (Indium Zinc Oxide) in which zinc oxide (ZnO) of from 2 to 20% is mixed into indium oxide.

Further, the insulating layer 12a is preferably formed by using silicon nitride containing an oxygen element of from 5% to 6% when Rutherford Back Scattering/Hydrogen Forward Scattering (RBS/HFS) analysis is performed, in the case where the first electrode 21 is formed from the above-mentioned conductive material. Moreover, the insulating layer 19 is preferably formed by using silicon nitride containing an oxygen element of from 5% to 6% when Rutherford Back Scattering/Hydrogen Forward Scattering (RBS/HFS) analysis is performed, as well as the insulating layer 12a.

The insulating layer 18 may be a multilayer or a single layer. Moreover, the insulating layer 18 may be formed from an inorganic substance such as silicon oxide, siloxane, or silicon nitride, an organic substance such as acryl or polyimide, or a material which includes both of an inorganic substance and an organic substance. At all events, the insulating layer 18 may be formed from an insulator. Note that it is preferably that the insulating layer 18 includes a layer which is formed from a substance having a self planarity property such as siloxane or acryl so that the surface of the insulating layer 18 is planarized. Moreover, in the case where the insulating layer 18 includes a substance having high moisture permeability such as siloxane or acryl, the diffusion of moisture toward the light emitting element 25 through the insulating layer 18 can be prevented by coating the insulating layer 18 with the insulating layer 19 as in the light emitting device according to this embodiment mode. However, the surface of the insulating layer 18 may be planarized by not only a method using a substance having a self planarity property but also a polishing method.

Moreover, the light emitting layer 23 may be formed from either an organic substance or an inorganic substance, and may be formed by including both of them.

Further, the structure of the transistor 17 is not especially limited in the light emitting device of the present invention. The transistor may be a single gate transistor or a multigate transistor. Moreover, the transistor may be a single drain structure, an LDD (Lightly Doped Drain) structure, or a structure in which an LDD region and a gate electrode are overlapped.

FIG. 2 shows a top view of the light emitting device of the present invention. A cross-sectional view of a part of the portion indicated by dotted line of A–A' in FIG. 2 is illustrated in FIG. 1. Therefore, like components in FIG. 2 are denoted by like numerals as of FIG. 1. To sum up, the reference numeral 14 denotes a semiconductor layer, the reference numeral 16 denotes a gate electrode, the reference numeral 20b denotes a wiring, and the reference numeral 20a denotes a connection portion. In addition, the reference numeral 21 denotes a first electrode and the reference numeral 22 denotes a bank layer. Moreover, though not shown in FIG. 1, the reference numerals 20c, 29a, and 29b denote a wiring, and the reference numerals 27 and 28 denote a transistor.

In the above-mentioned light emitting device, light emitted from the light emitting element 25 emits toward the outside through the first electrode 21, the insulating layer 19, the insulating layer 12a, and the substrate 11 in this order.

In the light emitting device of the present invention shown in the above, the reflection of light in extracting light toward the outside of the light emitting device is reduced, and in addition, the diffusion of impurities from the substrate to the transistor can be sufficiently prevented. Moreover, in the light emitting device of the present invention, multiple interference due to reflected light is suppressed by reducing the reflection of light in extracting light toward the outside of the light emitting device. As a result of suppressing the multiple interference, the variation of an emission spectrum depending on the angle of viewing a light extraction surface is reduced; and therefore, an image having favorable visibility can be displayed by the light emitting device.

EMBODIMENT MODE 2

In this embodiment mode, a method for manufacturing a light emitting device of the present invention shown in FIGS. 1 and 2 is described with reference to FIGS. 3A to 3E and FIGS. 4A to 4D.

An insulating layer 12a and an insulating layer 12b are sequentially stacked over a substrate 11, and then, a semiconductor layer 14 is stacked over the insulating layer 12b. Further, the insulating layer 12a is preferably formed from silicon nitride containing oxygen. The insulating layer 12a is more preferably a layer formed from silicon nitride containing an oxygen element of from 5% to 6% when Rutherford Back Scattering/Hydrogen Forward Scattering (RBS/HFS) analysis is performed. The layer formed from silicon nitride containing an oxygen element of from 5% to 6% can be formed by using gas as a material in which, for example, monosilane ($SiH_4$), ammonia ($NH_3$), nitrous oxide ($N_2O$), and hydrogen ($H_2$) are mixed so as to have a flow ratio of 1:10:2:40 respectively, by a plasma CVD method. Moreover, the insulating layer 12b is preferably formed by silicon oxide.

Next, the semiconductor layer 14 is processed in a desired shape. Further, the processing may be carried out by etching the semiconductor layer 14 with a resist mask. The semiconductor layer 14 may be formed from silicon, silicon germanium or the like. However, other material may be used for forming the semiconductor layer 14.

Next, a gate insulating layer 15 which covers the semiconductor layer 14, the insulating layer 12b, and the like is formed, and then, a conductive layer is further stacked over the gate insulating layer 15. The gate insulating layer 15 may be formed from silicon oxide or the like. However, other material may be used for forming the gate insulating layer 15. In addition, the gate insulating layer 15 may be a single layer or a multilayer in which a plurality of layers formed from different insulators are stacked.

Next, the conductive layer is processed in a desired shape to form a gate electrode 16. Here, wirings 29a and 29b (in FIG. 2) are formed as well as the gate electrode 16. Note that the processing may be carried out by etching the conductive layer with a resist mask. Further, the gate electrode may be formed from tungsten (W), aluminum or the like. Moreover, the gate electrode 16 may be a single layer or a multilayer in which a plurality of layers formed from different conductive material are stacked. For example, such a layer in which titanium nitride and tungsten are stacked may be used.

Next, a high-concentration impurity is added to the semiconductor layer 14 by using the gate electrode 16 as a mask. Thus, a transistor 17 including the semiconductor layer 14, the gate insulating layer 15 and the gate electrode 16 is manufactured.

Note that a manufacturing process of the transistor 17 is not particularly limited, and may be appropriately changed so that a transistor having a desired structure can be manufactured.

Next, an insulating layer 18 which covers the gate electrode 16, the wirings 29a and 29b, the gate insulating layer 15, and the like is formed. In this embodiment mode, the insulating layer 18 is formed by using an inorganic substance having a self planarity property such as siloxane. However, without being limited to this, an organic substance having a self planarity property may be also used. Moreover, the insulating layer 18 is not always required to be formed from a substance having a self planarity property, and may be a material formed from only a substance without a self planarity property. Alternatively, the insulating layer 18 may be a layer having a multilayer structure formed by combining a layer formed from a substance having a self planarity property with a layer formed from a substance without a self planarity property.

Next, a part of the insulating layer 18 is opened to make the insulating layer 18 have a first opening portion. Further, the first opening portion is formed to penetrate the gate insulating layer 15 and the insulating layer 12b and to reach the insulating layer 12a. Therefore, in the first opening portion, the insulating layer 12a is exposed. The first opening portion is preferably formed to make a side wall of the insulating layer 18 have a tilt angle of from 30° to 60°. The tilted side wall of the insulating layer 18 allows a layer formed from a conductive substance or an insulating substance to cover the side wall of the insulating layer 18 easily when the layer is formed over the side wall of the insulating layer 18.

Next, an insulating layer 19 is formed so as to cover the insulating layer 18 and the first opening portion. Thus, the side wall of the insulating layer 18 and the insulating layer 12a exposed in the first opening portion is covered with the insulating layer 19. Note that the insulating layer 19 is preferably formed by silicon nitride containing oxygen.

Next, a contact hole which penetrates the insulating layers 18 and 19 to reach the semiconductor layer 14 is formed. Note that the contact hole also penetrates the gate insulating layer 15.

Next, a conductive layer 20 which covers the insulating layer 19 and the like is formed, then, the conductive layer 20 is processed in a desired shape to form a connection portion 20a, wirings 20b and 20c and the like. At this time, the insulating layer 19 is made to be exposed in the first opening portion. The conductive layer 20 may be formed from a conductive material having low resistance such as aluminum. Further, the conductive layer 20 may be a single layer or a multilayer in which a plurality of layers formed from different conductive substances are stacked. For example, the conductive layer 20 may be formed by stacking titanium nitride, aluminum, and titanium nitride, sequentially.

Next, a conductive layer which covers the connection portion 20a and the like and which is formed from ITO or the like as described in the Embodiment Mode 1 is formed, and then, the conductive layer is processed to form a first electrode 21. Here, the first electrode 21 is formed over the insulating layer 19 which is overlapped with the insulating layer 12a inside the first opening portion. Moreover, a part of the first electrode 21 is provided to be in contact with the connection portion 20a. In this embodiment mode, the first electrode 21 is in contact with the connection portion 20a over the insulating layer 19. Accordingly, the transistor 17 and the first electrode 21 are electrically connected through the connection portion 20a.

Further, a hydrogenation process, an activation process of an impurity by utilizing heat, or the like may be provided during the foregoing process after manufacturing the transistor 17, if necessary.

Next, a bank layer 22 that has a second opening portion in which a part of the first electrode 21 is to be exposed and that covers the connection portion 20a, the insulating layer 19, and the like is formed. Here, the bank layer 22 may be formed by processing a resin material having photosensitivity in a desired shape by means of light-exposure and development, or may be formed by forming a layer made of an inorganic substance or an organic substance having no photosensitivity, and etching to be processed in a desired shape. Note that the bank layer 22 is preferably formed to have a shape in which an edge portion has a curvature.

Next, a light emitting layer 23 which covers the first electrode 21 exposed from the bank layer 22 is formed. The light emitting layer 23 may be formed by using any of a vapor deposition method, an ink-jetting method, a spin coating method, or the like. Note that a layer formed from a high molecular weight material in which polystyrenesulphonic acid (PSS) and polyethylene dioxythiophene (PEDOT) are mixed is provided in a part of the light emitting layer 23 in the case where a depression/projection is formed over the insulating layer 12a; and therefore, the depression/projection can be relieved.

Next, a second electrode 24 which covers the light emitting layer 23 is formed. Thus, a light emitting element 25 including the first electrode 21, the light emitting layer 23 and the second electrode 24 can be manufactured. Note that the second electrode 24 may be an electrode which transmits visible light like the first electrode 21 or may be an electrode which does not transmit visible light formed by using aluminum or the like.

As described above, the light emitting device according to the present invention as shown in FIG. 1 can be manufactured.

EMBODIMENT MODE 3

In this embodiment mode, a light emitting device of the present invention in which a structure and a method for manufacturing thereof are different from that of the light emitting device in Embodiment Modes 1 and 2 is described with reference to FIGS. 5A to 5E and FIGS. 6A and 6B.

An insulating layer 52a and an insulating layer 52b are sequentially stacked over a substrate 51, and then, a semiconductor layer 53 is stacked over the insulating layer 52b. Note that the insulating layer 52a is preferably formed from silicon nitride containing oxygen. The insulating layer 52a is more preferably a layer formed from silicon nitride containing an oxygen element of from 5% to 6% when Rutherford Back Scattering/Hydrogen Forward Scattering (RBS/HFS) analysis is performed. The layer formed from silicon nitride containing an oxygen element of from 5% to 6% can be formed by using gas as a material in which, for example, monosilane ($SiH_4$), ammonia ($NH_3$), nitrous oxide ($N_2O$), and hydrogen ($H_2$) are mixed so as to have a flow ratio of 1:10:2:40 respectively, by a plasma CVD method. Moreover, the insulating layer 52b is preferably formed by using silicon oxide.

Next, the semiconductor layer 53 is processed in a desired shape. Further, the processing may be carried out by etching the semiconductor layer 53 and with a resist mask. The semiconductor layer 53 may be formed from silicon, silicon germanium or the like. However, other material may be used for forming the semiconductor layer 53.

After processing the semiconductor layer 53, the insulating layer 52b is also processed by etching. At this time, the resist mask used for the processing the semiconductor layer 53 may be used again.

Next, a gate insulating layer 54 which covers the semiconductor layer 53, the insulating layer 52a, and the like is formed. A conductive layer is further stacked over the gate insulating layer 54. The gate insulating layer 54 may be formed from silicon oxide or the like. However, other material may be used for forming the gate insulating layer 54. In addition, the gate insulating layer 54 may be a single layer or a multilayer in which a plurality of layers formed from different insulators are stacked.

Next, the conductive layer is processed in a desired shape to form a gate electrode 55. Here, a wiring and the like are formed as well as the gate electrode 55. Further, the processing may be carried out by etching the conductive layer with a resist mask. Further, the gate electrode may be formed from tungsten (W), aluminum or the like. In addition, the gate electrode 55 may be a single layer or a multilayer in which a plurality of layers formed from different conductive material are stacked. For example, such a layer in which titanium nitride and tungsten are stacked may be used.

Next, a high-concentration impurity is added to the semiconductor layer 53 by using the gate electrode 55 as a mask. Thus, a transistor 56 including the semiconductor layer 53, the gate insulating layer 54, and the gate electrode 55 are manufactured.

Further, a manufacturing process of the transistor 56 is not particularly limited, and may be appropriately varied so that a transistor having a desired structure can be manufactured.

Next, an insulating layer 57 which covers the gate electrode 55, the wiring, the gate insulating layer 54, and the like is formed. In this embodiment mode, the insulating layer 57 is formed by using an inorganic substance having a self planarity property such as siloxane. However, without being limited to this, an organic substance having a self planarity property may be also used. In addition, the insulating layer 57 is not required to be formed from a substance having a self planarity property, and may be formed from only a substance without a self planarity property. Alternatively, the insulating layer 57 may be a layer having multilayer structure formed by combining a layer formed from a substance having a self planarity property with a layer formed from a substance without a self planarity property.

Next, a part of the insulating layer 57 is opened to make the insulating layer 57 have a first opening portion. Further, the first opening portion is formed to penetrate the gate insulating layer 54 and to reach the insulating layer 52a. Therefore, in the first opening portion, the insulating layer 52a is exposed. The first opening portion is preferably formed to make a side wall of the insulating layer 57 have a tilt angle of from 30° to 60°. The tilted side wall of the insulating layer 57 allows a layer formed from a conductive substance or an insulating substance to cover the side wall of the insulating layer 57 easily when the layer is formed over the side wall of insulating layer 57.

Moreover, the opening portion is formed, and in addition, a contact hole which penetrates the insulating layer 57 and the gate insulating layer 54 to reach the semiconductor layer 53 is formed.

Next, a conductive layer 58 which covers the insulating layer 57 and the like is formed, then, the conductive layer 58 is processed in a desired shape to form a connection portion 58a, a wiring 58b, and the like. At this time, the insulating layer 52a is made to be exposed in the first opening portion. The conductive layer 58 may be formed from a conductive substance having low resistance such as aluminum. Further, the conductive layer 58 may be a single layer or a multilayer in which a plurality of layers formed from different conductive substance are stacked. For example, the conductive layer 58 may be formed by stacking titanium nitride, aluminum, and titanium nitride, sequentially.

Next, a conductive layer that covers the connection portion 58a and the like and that is formed from a conductive substance which transmits visible light is formed. Then, the conductive layer is processed to form a first electrode 59. Here, the first electrode 59 is formed to be stacked over the insulating layer 52a inside the first opening portion. Moreover, a part of the first electrode 59 is provided to be in contact with the connection portion 58a. In this embodiment mode, the first electrode 59 is in contact with the connection portion 58a over the insulating layer 57. Accordingly, the transistor 56 and the first electrode 59 are electrically connected through the connection portion 58a. As described in Embodiment Mode 1, ITO or the like may be used as a conductive substance which transmits visible light.

Further, a hydrogenation process, an activation process of an impurity by utilizing heat, or the like may be provided during the foregoing process after manufacturing the transistor 56, if necessary.

Next, a bank layer 60 that has an opening portion in which a part of the first electrode 59 is to be exposed and that covers the connection portion 58a, the insulating layer 57, and the like is formed. Here, the bank layer 60 may be formed by processing a resin material having photosensitivity in a desired shape by means of light-exposure and development, or may be formed by forming a layer made of an inorganic substance or an organic substance having no photosensitivity, and etching to be processed in a desired shape.

Next, a light emitting layer 61 which covers the first electrode 59 exposed from the bank layer 60 is formed. The light emitting layer 61 may be formed by using any of a vapor deposition method, an ink-jetting method, a spin coating method, or the like. Further, in the case where a depression/projection is formed over the insulating layer 52a, a layer formed from a high molecular weight material such as PEDOT may be provided over a part of the light emitting layer 61. Therefore, the depression/projection can be relieved.

Next, a second electrode 62 which covers the light emitting layer 61 is formed. Thus, a light emitting element 63 including the first electrode 59, the light emitting layer 61, and the second electrode 62 can be manufactured.

As described above, a light emitting device of the present invention can be manufactured also by a manufacturing method by which the insulating layer 52a is processed in succession of the processing of the semiconductor layer 53.

Figure 6A:
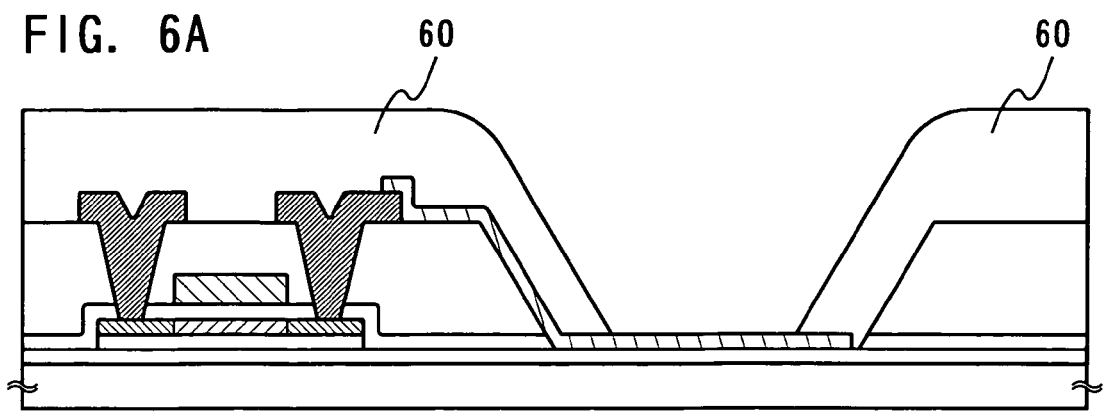
FIGS. 6A and 6B are explanatory views of a method for manufacturing a light emitting device according to the present invention.
Figure 6B:
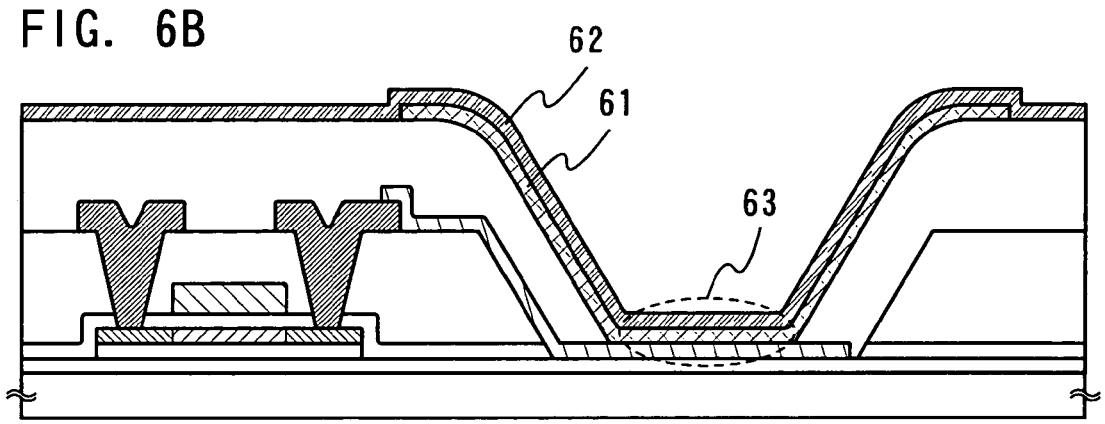

Note that in the light emitting device shown in FIG. 6B, an insulating layer (corresponding to the insulating layer 19 in FIG. 1) which covers a side wall of an insulating layer having a first opening portion is not formed. In the case where moisture incorporation into a light emitting element through an insulating layer which covers a transistor is sufficiently suppressed, an insulating layer which covers a side wall of an insulating layer having a first opening portion may not be provided like the light emitting device shown in FIG. 6B.

Further, the first electrode is not required to cover the inside of the first opening portion entirely. For example, a structure in which only a part of the inside of the first opening portion is covered may be employed like the light emitting device shown in FIG. 6B.

EMBODIMENT MODE 4

In this embodiment mode, a light emitting device of the present invention having a structure different from a structure shown in Embodiment Modes 1 to 3 is described with reference to FIG. 7.

Figure 7:
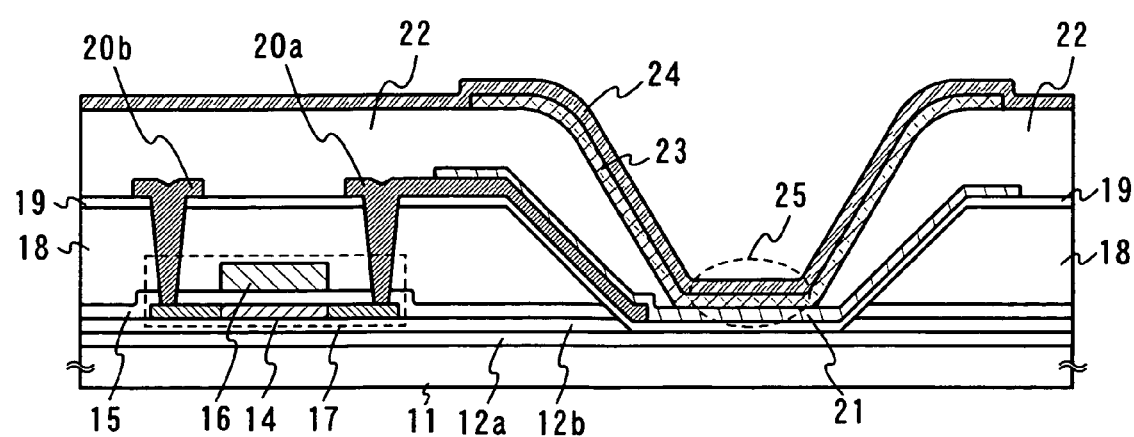
FIG. 7 is an explanatory cross-sectional view of the structure of a light emitting device according to the present invention.

In a light emitting device shown in FIG. 7, a connection portion 20a which connects a transistor 17 and a first electrode 21 covers a part of a side wall of an insulating layer 18 to be overlapped with the first electrode 21 at the part of the side wall. Other structure is the same as a structure shown in FIG. 1.

As described above, a means for connecting the transistor 17 and the first electrode 21 is not limited to that shown in FIG. 1. The means for connecting as shown in FIG. 7 may be employed.

EMBODIMENT MODE 5

In this embodiment mode, a light emitting device of the present invention having a structure different from a structure shown in Embodiment Modes 1 to 4 is described with reference to FIG. 8.

Figure 8:
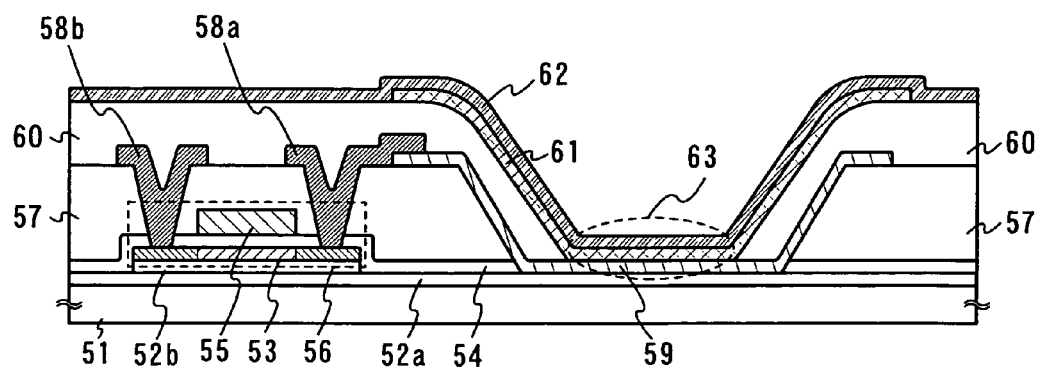
FIG. 8 is an explanatory cross-sectional view of the structure of a light emitting device according to the present invention.

In a light emitting device shown in FIG. 8, a connection portion 58a which connects a transistor 56 to a first electrode 59 is overlapped with the first electrode 59 so that the first electrode 59 is provided to be lower layer than the connection portion 58a. Other structure is the same as a structure shown in FIG. 6B.

Further, the light emitting device shown in FIG. 8 can be manufactured by reversing the order of manufacturing processes of the first electrode 59, the connection portion 58a, a wiring 58b, and the like in the method for manufacturing the light emitting device described in Embodiment Mode 3.

As described above, a means for connecting the transistor 56 and the first electrode 59 is not limited to that shown in FIG. 6B, and the means for connecting as shown in FIG. 8 may be employed. Moreover, the means for connecting shown in FIG. 8 may be applied to FIG. 8 or the like.

EMBODIMENT MODE 6

In this embodiment mode, a light emitting device of the present invention having a structure different from a structure shown in Embodiment Modes 1 to 5 is described with reference to FIG. 9.

Figure 9:
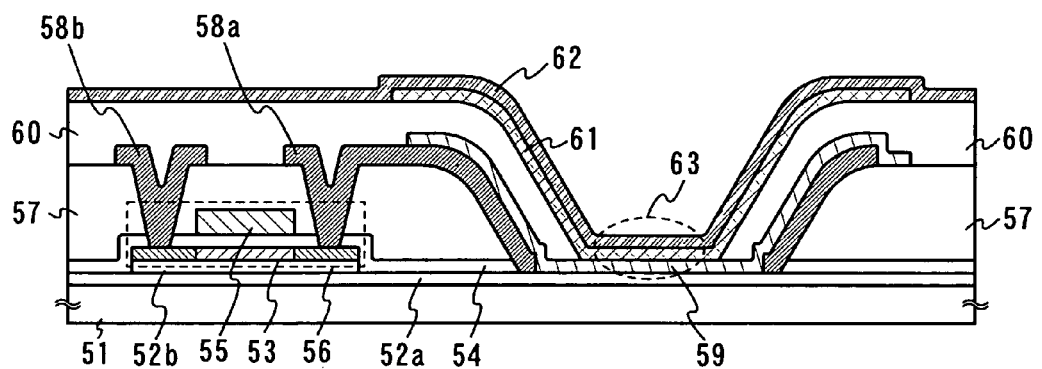
FIG. 9 is an explanatory cross-sectional view of the structure of a light emitting device according to the present invention.

In a light emitting device shown in FIG. 9, a connection portion 58a that connects a transistor 56 and a first electrode 59 which is a component of a light emitting element 63 covers a entirety of a side wall of an insulating layer 57 to be partly overlapped with the first electrode 59. Other structure is the same as a structure shown in FIG. 6B.

Moreover, in the light emitting device of this embodiment mode, both of the first electrode 59 and a second electrode 62 transmit visible light.

Figure 10:
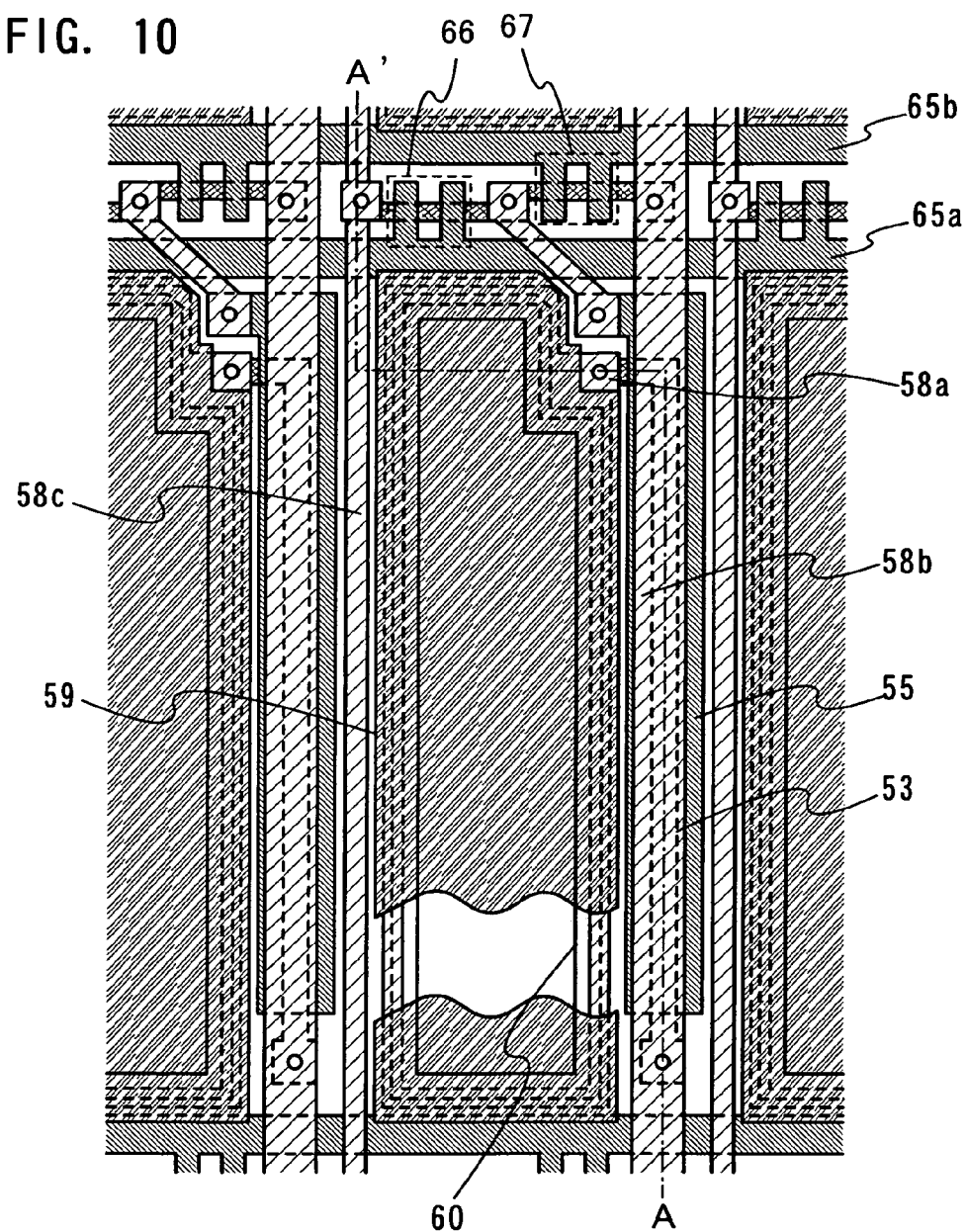
FIG. 10 is an explanatory top view of the structure of a light emitting device according to the present invention.
Figure 11A:
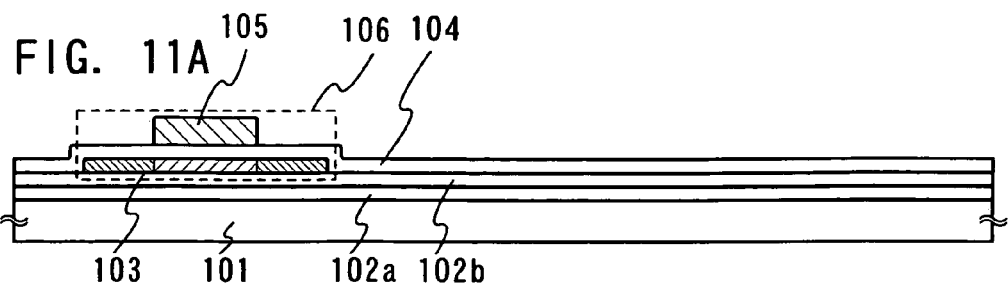
FIGS. 11A to 11E are explanatory views of a method for manufacturing a light emitting device according to the present invention.
Figure 11B:
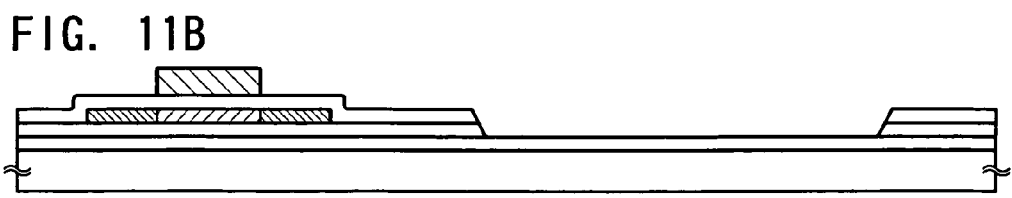
Figure 11C:
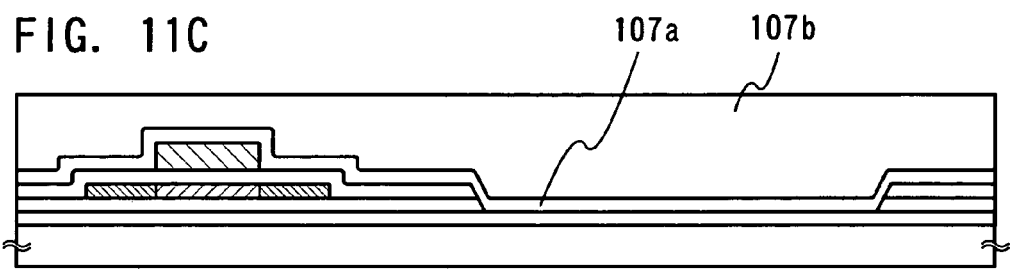
Figure 11D:
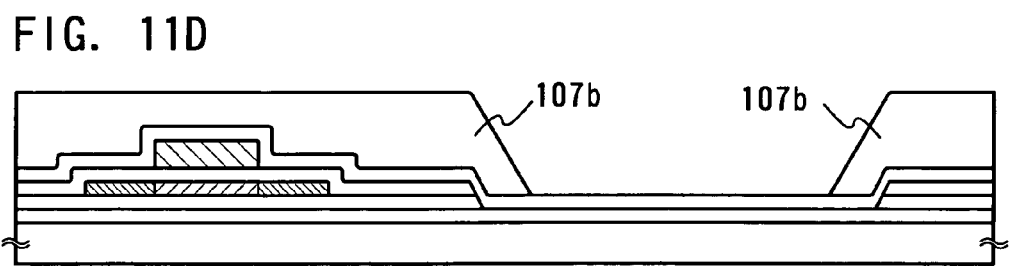
Figure 11E:
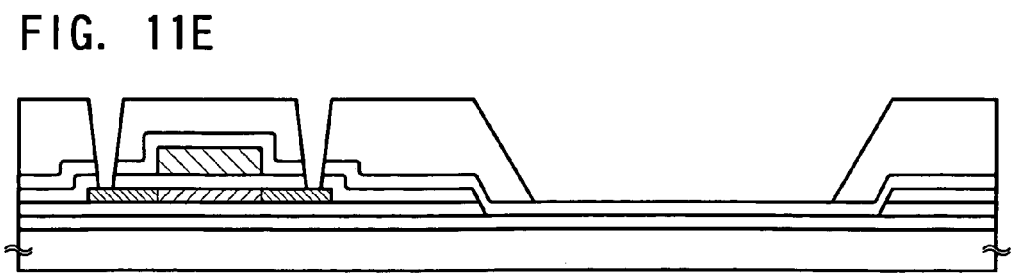
Figure 12A:
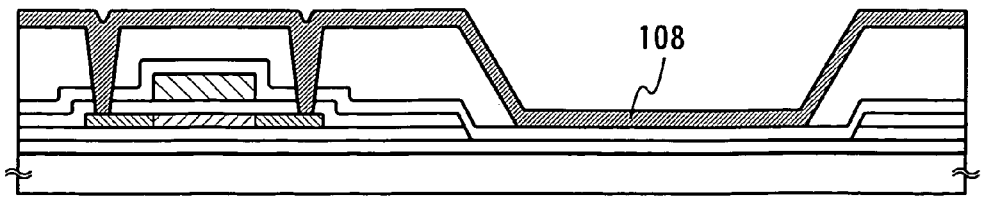
FIGS. 12A to 12E are explanatory views of a method for manufacturing a light emitting device according to the present invention.
Figure 12B:
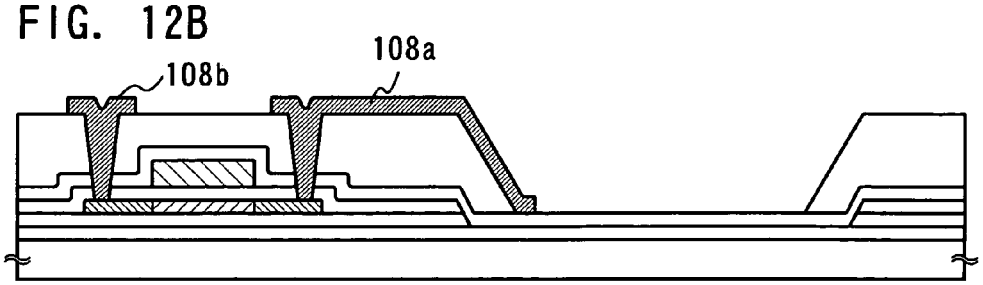
Figure 12C:
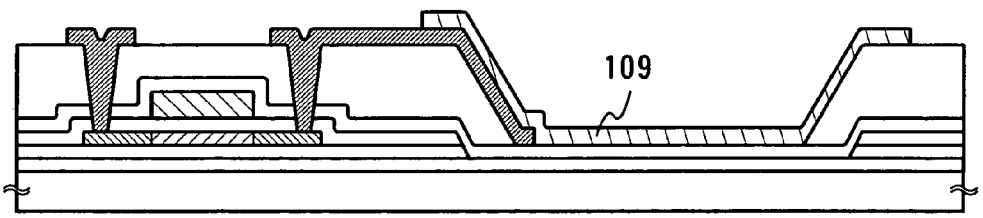
Figure 12D:
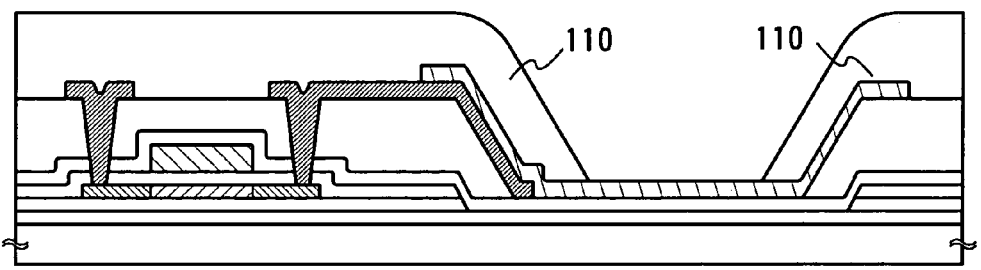
Figure 12E:
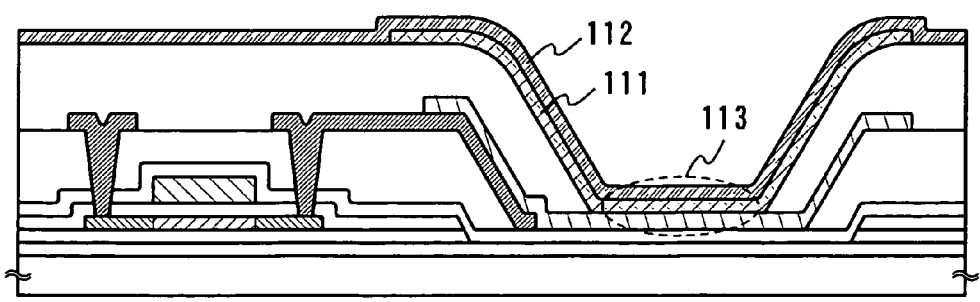

FIG. 10 is a top view of a light emitting device of the present invention shown in FIG. 9. A cross-sectional view of a part of the portion indicated by dotted line of A–A' in FIG. 10 is illustrated in FIG. 9. Therefore, like components in FIG. 9 are denoted by like numerals as of FIG. 9. To sum up, the reference numeral 53 denotes a semiconductor layer, the reference numeral 55 denotes a gate electrode, the reference numeral 58b denotes a wiring, and the reference numeral 58a denotes a connection portion. In addition, the reference numeral 59 denotes a first electrode and the reference numeral 60 denotes a bank layer. Moreover, though not shown in FIG. 9, the reference numerals 58c, 65a, and 65b denote a wiring, and the reference numerals 66 and 67 denote a transistor.

As shown in FIGS. 9 and 10, the connection portion 58a is provided to cover the entirety of a side wall of the insulating layer 57. Thus, the entirety of the side wall of the insulating layer 57 may be covered with the connection portion 58, or may be covered with a conductive layer and the like formed from the same layer of the connection portion 58a.

In a light emitting device having both electrodes for composing a light emitting element can transmit visible light, a part of light emitted from one of the electrodes may reflect during extraction of the light toward the outside of the light emitting device, and may return to the other electrode side. Then, the returned light may interfere in light or the like from the light emitting layer and vary a spectrum and the like of light extracted from the other electrode side. However, the light emitting device of the present invention can suppress the reflection; therefore, it is effective also in the case where both of the first electrode 59 and the second electrode 62 can transmit visible light.

EMBODIMENT MODE 7

In this embodiment mode, a light emitting device of the present invention having a structure different from a structure shown in Embodiment Modes 1 to 3 is described with reference to FIGS. 11 and 12.

An insulating layer 102a and an insulating layer 102b are sequentially stacked over a substrate 101, then, a semiconductor layer 103 is stacked over the insulating layer 102b. Further, the insulating layer 102a is preferably formed from silicon nitride containing oxygen. The insulating layer 102a is more preferably a layer formed from silicon nitride containing an oxygen element of from 5% to 6% when Rutherford Back Scattering/Hydrogen Forward Scattering (RBS/HFS) analysis is performed. The layer formed from silicon nitride containing an oxygen element of from 5% to 6% can be formed by using gas as a material in which, for example, monosilane ($SiH_4$), ammonia ($NH_3$), nitrous oxide ($N_2O$), and hydrogen ($H_2$) are mixed so as to have a flow ratio of 1:10:2:40 respectively, by a plasma CVD method. Moreover, the insulating layer 102b is preferably formed by using silicon oxide.

Next, the semiconductor layer 103 is processed in a desired shape. Further, the processing may be carried out by etching the semiconductor layer 103 with a resist mask. The semiconductor layer 103 may be formed from silicon, silicon germanium or the like. However, other material may be used for forming the semiconductor layer 103.

Next, a gate insulating layer 104 which covers the semiconductor layer 103, the insulating layer 102b, and the like is formed. A conductive layer is further stacked over the gate insulating layer 104. The gate insulating layer 104 may be formed from silicon oxide or the like. However, other material may be used for forming the gate insulating layer 104. In addition, the gate insulating layer 104 may be a single layer or a multilayer in which a plurality of layers formed from different insulators are stacked.

Next, the conductive layer is processed in a desired shape to form a gate electrode 105. Here, a wiring and the like are formed as well as forming the gate electrode 105. Further, the processing may be carried out by etching the conductive layer with a resist mask. The gate electrode 105 may be formed from tungsten (W), aluminum or the like. In addition, the gate electrode 105 may be a single layer or a multilayer in which a plurality of layers formed from different conductive material are stacked. For example, a layer in which titanium nitride and tungsten are stacked may be used.

Next, a high-concentration impurity is added to the semiconductor layer 103 by using the gate electrode 105 as a mask. Thus, a transistor 106 including the semiconductor layer 103, the gate insulating layer 104, and the gate electrode 105 is manufactured.

Further, a manufacturing process of the transistor 106 is not particularly limited, and may be appropriately varied so that a transistor having a desired structure can be manufactured.

Next, a part of the gate insulating layer 104 and the insulating layer 102b is etched to form an opening portion which exposes a part of the insulating layer 102a. Further, the opening portion is provided in a portion in which a light emitting element is to be formed by a subsequent process.

Next, an insulating layer 107 which covers the opening portion, the gate electrode 105, the wiring, the gate insulating layer 104, and the like is formed. In this embodiment mode, the insulating layer 107 includes two layers having an insulating layer 107a as a lower layer and an insulating layer 107b as an upper layer. Moreover, in this embodiment mode, the insulating layer 102a is preferably formed from silicon nitride containing oxygen. The insulating layer 102a is more preferably a layer formed from silicon nitride containing an oxygen element of from 5% to 6% when Rutherford Back Scattering/Hydrogen Forward Scattering (RBS/HFS) analysis is performed. The layer formed from silicon nitride containing an oxygen element of from 5% to 6% can be formed by using gas as a material in which, for example, monosilane ($SiH_4$), ammonia ($NH_3$), nitrous oxide ($N_2O$), and hydrogen ($H_2$) are mixed so as to have a flow ratio of 1:10:2:40 respectively, by a plasma CVD method. The layer formed as described above contains hydrogen. The hydrogen can be utilized for hydrogenation so as to improve a state of an interface between the semiconductor layer 103 and the gate insulating layer 104. Moreover, in this embodiment mode, the insulating layer 107b is formed by using an inorganic substance having a self planarity property such as siloxane. However, without being limited to this, an organic substance having a self planarity property may be also used. Moreover, the insulating layer 107b is not required to be formed from a substance having a self planarity property, and may be formed from only a substance without a self planarity property. Alternatively, the insulating layer 107b may be a layer having a multilayer structure formed by combining a layer formed from a substance having a self planarity property with a layer formed from a substance without a self planarity property.

Next, a part of the insulating layer 107b is opened to make the insulating layer 107b have a first opening portion. Further, the first opening portion is provided the inside of an opening portion which penetrates the gate insulating layer 104 and the insulating layer 102b. Therefore, in the first opening portion, the insulating layer 107a is exposed. The first opening portion is preferably formed to make a side wall of the insulating layer 107b have a tilt angle of from 30° to 60°. The tilted side wall of the insulating layer 107b allows a layer formed from a conductive substance or an insulating substance to cover the side wall of the insulating layer 107b easily when the layer is formed over the side wall of insulating layer 107b.

Next, a contact hole which penetrates the insulating layer 107 and the gate insulating layer 104 to reach the semiconductor layer 103 is formed.

Next, a conductive layer 108 which covers the insulating layer 107 and the like is formed, then, the conductive layer 108 is processed in a desired shape to form a connection portion 108a, a wiring 108b, and the like. At this time, the insulating layer 107b is made to be exposed in the first opening portion. The conductive layer 108 may be formed from a conductive substance having low resistance such as aluminum. Further, the conductive layer 108 may be a single layer or a multilayer in which a plurality of layers formed from different conductive substances are stacked. For example, the conductive layer 108 may be formed by stacking titanium nitride, aluminum, and titanium nitride, sequentially.

Next, a conductive layer that covers the connection portion 108a and the like and that is formed from a conductive substance which transmits light is formed, and then, the conductive layer is processed to form a first electrode 109. Here, the first electrode 109 is formed to be overlapped with the insulating layer 107b inside the first opening portion. In addition, a part of the first electrode 109 is provided to be in contact with the connection portion 108a. In this embodiment mode, the first electrode 109 is in contact with the connection portion 108a over the insulating layer 107b. Accordingly, the transistor 106 and the first electrode 109 are electrically connected to each other through the connection portion 108a. As a conductive substance which transmits visible light, ITO or the like may be used as described in Embodiment Mode 1.

Further, a hydrogenation process, an activation process of an impurity by utilizing heat, or the like may be provided during the foregoing process after manufacturing the transistor 106, if necessary.

Next, a bank layer 110 that has an opening portion in which a part of the first electrode 109 is to be exposed and that covers the connection portion 108a, the insulating layer 107 and the like is formed. Here, the bank layer 110 may be formed by processing a resin material having photosensitivity in a desired shape by means of light-exposure and development, or may be formed by forming a layer made from an inorganic substance or an organic substance having no photosensitivity, and etching to be processed in a desired shape.

Next, a light emitting layer 111 which covers the first electrode 109 exposed from the bank layer 110 is formed. The light emitting layer 111 may be formed by using any of a vapor deposition method, an ink-jetting method, a spin coating method, or the like. Further, in the case where a depression/projection is formed over the insulating layer 107a, a layer formed from a high molecular weight material such as PEDOT may be provided over a part of the light emitting layer 111. Therefore, the depression/projection can be relieved.

Next, a second electrode 112 which covers the light emitting layer 111 is formed. Thus, a light emitting element 113 including the first electrode 109, the light emitting layer 111, and the second electrode 112 can be manufactured.

A light emitting device of the present invention can be manufactured also by the above described manufacturing method. In addition, a method shown in Embodiment Modes 4 and 5 may be applied to connecting the first electrode to the transistor.

EMBODIMENT MODE 8

In Embodiment Modes 1 to 7, a light emitting device in which a transistor and a connection portion which connects the transistor and a first electrode of a light emitting element are electrically connected by stacking is described. However, the structure of a light emitting device is not limited to this, and a light emitting device having a structure in which a first electrode of a light emitting element and a connection portion each are provided by different layers interposing an insulating layer therebetween, and in which the first electrode of the light emitting element and the connection portion are electrically connected to each other through a contact hole which penetrates the insulating layer may be also employed.

EMBODIMENT 1

In this embodiment, a light emitting device to which the present invention is applied is described. However, a structure of the light emitting device of the present invention, a substance included in the light emitting device, and the like are not limited to those shown in this embodiment.

One embodiment of the present invention shown in FIG. 1 is described.

In this embodiment, a light emitting layer 23 which is a component of a light emitting element 25 is formed by a plurality of layers. The plurality of layers are formed by stacking layers formed from a substance selected from the group consisting of a substance having a high carrier transporting property or a substance having a high carrier injecting property. Additionally, the plurality of layers partly includes a substance having a high light emitting property. A substance which constitutes the light emitting layer 23 may be either an inorganic substance or an organic substance. In the case of an organic substance, either a low molecular weight or a high molecular weight may be used.

Here, as a light emitting substance, 4-dicyanomethylene-2-methyl-6-[2-(1,1,7,7-tetramethyljulolidine-9-yl)ethenyl]-4H-pyran (abbreviated DCJT), 4-dicyanomethylene-2-t-butyl-6-[2-(1,1,7,7-tetramethyljulolidine-9-yl)ethenyl]-4H-pyran (abbreviated DCJTB), Periflanthene, 2,5-dicyano-1,4-bis[2-(10-methoxy-1,1,7,7-tetramethyljulolidine-9-yl) ethenyl]benzene, N,N'-dimethylquinacridone (abbreviated DMQd), coumarin 6, coumarin 545T, tris(8-quinolinolato) aluminum (abbreviated $Alq_3$), 9,9'-biantolyl, 9,10-diphenylanthracene (abbreviated DPA), 9,10-bis(2-naphthyl)anthracene (abbreviated DNA) or the like can be used. Moreover, other material may be used.

Note that a light emitting substance in a triplet exited state including a metal complex and the like may be used besides a light emitting substance in a singlet exited state as described above. For example, among a pixel emitting red light, a pixel emitting green light, and a pixel emitting blue light, the pixel emitting red light having comparatively short half-brightness life is formed from a light emitting substance in a triplet exited state, and other pixel is formed from a light emitting substance in a singlet exited state. A light emitting substance in a triplet exited state has good light emission efficiency; and has a feature of consuming low power consumption to obtain the same luminance. That is, in the case of being applied to a red color pixel, the amount of current for being applied to a light emitting element becomes lower; and thus, the reliability can be enhanced. To lower the power consumption, the pixel emitting red light and the pixel emitting green light may be formed from a light emitting substance in a triplet exited state, and the pixel emitting blue light may be formed from a light emitting substance in a singlet exited state. By forming a light emitting element of green color in which human visibility is high from a light emitting substance in a triplet exited state, power consumption can be further lowered.

A material using a metal complex as dopant is given as one example of a light emitting substance in a triplet exited state, for example, a metal complex including platinum that is a third transition element as a central metal, a metal complex including iridium as a central metal, and the like are well known. A light emitting substance in a triplet exited state is not limited to these compounds, and a compound having the above structure and having an element belonging to from 8 group to 10 group in the periodic table as a central metal can be used.

As a substance having a high carrier transporting property, especially, a substance having a high electron transporting property, for example, a metal complex having a quinoline skeleton or a benzoquinoline skeleton such as tris(8-quinolinolato)aluminum (abbreviated $Alq_3$), tris(5-methyl-8-quinolinolato)aluminum (abbreviated $Almq_3$), bis(10-hydroxybenzo[h]quinolinato)beryllium (abbreviated $BeBq_2$), or bis(2-methyl-8-quinolinolato)-4-phenylphenolate-aluminum (abbreviated BAlq) can be given. Further, as a substance having a high hole transporting property, for example, a compound of aromatic amine system (namely, having a bond of benzene ring-nitrogen) such as 4,4'-bis[N-(1-naphthyl)-N-phenyl-amino]-biphenyl (abbreviated α-NPD), 4,4'-bis[N-(3-methylphenyl)-N-phenyl-amino]-biphenyl (abbreviated TPD), 4,4',4"-tris(N,N-diphenyl-amino)-triphenylamine (abbreviated TDATA), or 4,4',4"-tris[N-(3-methylphenyl)-N-phenyl-amino]-triphenylamine (abbreviated MTDATA) can be used. Moreover, as a substance having a high carrier injecting property, especially, as a substance having a high electron injecting property, for example, a compound of an alkali metal or an alkali earth metal such as lithium fluoride (LiF), cesium fluoride (CsF), or calcium fluoride ($CaF_2$) can be used. Besides, a mixture of a substance having a high electron transporting property such as $Alq_3$ with an alkaline earth metal such as magnesium (Mg) may be given. For example, as a substance having a high hole injecting property, metal oxide such as molybdenum oxide (MoOx), vanadium oxide (VOx), ruthenium oxide (RuOx), tungsten oxide (WOx), manganese oxide (MnOx) is cited. Besides, a compound of phthalocyanine system such as phthalocyanine (abbreviated $H_2Pc$) or copper phthalocyanine (CuPC) is given.

A transistor 17 is a staggered transistor, but an inverted staggered transistor may be also used. In the case of an inverted staggered transistor, a so-called channel protection transistor having a protective layer over a semiconductor layer or a so-called channel etched transistor in which a part of a semiconductor layer is etched may be used.

Moreover, a semiconductor layer 14 may be either crystalline or amorphous. In addition, the semiconductor may be semi-amorphous or the like.

A semi-amorphous semiconductor is described hereinafter. A semi-amorphous semiconductor has an intermediate structure between a amorphous structure and a crystalline structure (including a single crystalline and polycrystalline structure), a third state which is stable in a view of free energy, and a crystalline region having a short-range order and lattice distortion. In addition, at least a part of the film includes a crystal grain having a grain diameter of from 0.5 nm to 20 nm. The Raman spectrum shifts to the lower wave number side than 520 cm$^{-1}$. Diffraction peaks of (111) and (220) which is thought to be derived from Si crystalline lattice are observed by X-ray diffraction. At least 1 atomic % or more of hydrogen or halogen is contained in a semiconductor including semi-amorphous for terminating a dangling bond. The semi-amorphous semiconductor is also referred to as a so-called microcrystal semiconductor. It is formed by glow discharge decomposition (plasma CVD) of a silicide gas. As the silicide gas, it is possible to use $SiH_4$, additionally, $Si_2H_6$, $SiH_2Cl_2$, $SiHCl_3$, $SiCl_4$, $SiF_4$ or the like. The silicide gas may be diluted with $H_2$, or $H_2$ and one or more kinds of rare gas elements selected from the group consisting of $H_2$, He, Ar, Kr and Ne. Dilution ratio is in a range of from 2 times to 1000 times. Pressure is in a range of from 0.1 Pa to 133 Pa, and power frequency is from 1 MHz to 120 MHz, preferably, from 13 MHz to 60 MHz. The temperature for heating a substrate may be 300° C. or less, preferably, in a range of from 100° C. to 250° C. As for an impurity element in a film, impurities of atmospheric component such as oxygen, nitrogen, or carbon are preferably set to be $1 \times 10^{20}$ cm$^{-1}$ or less, in particular, the oxygen concentration is set to be $5 \times 10^{19}$/cm$^3$ or less, preferably, $1 \times 10^{19}$/cm$^3$ or less. Further, mobility of a TFT (a thin film transistor) using a semi-amorphous semiconductor is approximately from 1 m$^2$/Vsec to 10 m$^2$/Vsec.

As a specific example of the crystalline semiconductor layer, the layer formed from single crystalline silicon, polycrystalline silicon, silicon germanium, or the like is given. These layers may be formed by laser crystallization, or for example, crystallizing with a solid phase growth method using nickel or the like.

Further, in the case where the semiconductor layer is formed from a amorphous substance such as amorphous silicon, it is preferable that all of the transistor 17 and the other transistors (transistors for composing a circuit that drives a light emitting element) are a light emitting device having circuits composed of n-channel transistors. As for the other cases, the transistor 17 and the other transistors may be a light emitting device having a circuit composed of either an n-channel type transistor or a p-channel type transistor, or may be a light emitting device having a circuit composed of both the transistors.

The radius of curvature of the edge portion of the bank layer 22 is preferably varied continuously as shown in FIG. 1. Additionally, the bank layer 22 is formed by using acryl, siloxane (a substance in which a skeletal structure is formed by a bond of silicon (Si) and oxygen (O), and which contains at least hydrogen as a substituent), resist, silicon oxide, or the like. Further, the bank layer 22 may be formed by either an inorganic film or an organic film, or may be formed by using both of them.

In addition, the light emitting element 25 may have a structure in which the first electrode 21 serves as an anode and the second electrode 24 serves as a cathode, or a structure in which the first electrode 21 serves as a cathode and the second electrode 24 serves as an anode. Note that the transistor 17 is a p-channel transistor in the former case, and the transistor 17 is an n-channel transistor in the latter case.

The light emitting device of the present invention is formed so that a plurality of pixels including the light emitting element 25 and the transistor 17 as described above are arranged in matrix form. Further, the light emitting layer may have a structure in which light emitting layers having different wavelength ranges of light are respectively formed in each pixel to perform color display. Typically, light emitting layers which respectively correspond to each color of R (red), G (green), and B (blue) are formed. In this case, by forming a structure that a filter (a colored layer) which transmits light in the wavelength range is provided in light emission side of the pixel, color purity can be improved and a pixel portion can be prevented from being a mirror surface (glare). By providing a filter (a colored layer), a circularly polarizing plate or the like which is conventionally thought to be required can be omitted, and the loss of light emitted from the light emitting layer can be eliminated. Moreover, the change of color tone which occurs in the case where the pixel portion (a display screen) is viewed from an oblique direction can be further eliminated.

Moreover, a structure in which a light emitting layer exhibits monochromatic or white light can be employed, in addition to the structure in which color display is performed by providing the light emitting layer which corresponds to each color as described above. In case of using a white light emitting material, color display can be performed by employing a structure that a filter (a colored layer) which transmits light having a particular wavelength is provided in light emission side of the pixel.

Further, to form the light emitting layer which emits white light, $Alq_3$, $Alq_3$ doped partly with Nile red, $Alq_3$, p-EtTAZ, TPD (aromatic diamine) are sequentially stacked by using a vapor deposition method, for example; accordingly, white color can be obtained. In the case where the light emitting layer is formed by an application method using a spin coat, the light emitting layer is preferably formed in accordance with the procedure, that is, a material is applied, and baked by vacuum heating. For example, poly(ethylenedioxythiophene)/poly(styrenesulfonate) water solution (PEDOT/PSS) is entirely applied and baked, then, a polyvinylcarbazole (PVK) solution doped with pigment (1,1,4,4-tetraphenyl-1,3-butadiene (TPB), 4-dicyanomethylene-2-methyl-6-(p-dimethylamino-styryl)-4H-pyran (DCM1), Nile red, coumarin 6, or the like) may be entirely applied and baked thereover.

The light emitting layer can be formed by a single layer, in addition to a multilayer as described above. In this case, 1,3,4-oxadiazole derivative (PBD) may be dispersed into polyvinylcarbazole (PVK). White light can be obtained by dispersing 30 wt % of PBD and dispersing the four kinds of pigment (TPB, coumarin 6, DCM1, Nile red) of the appropriate amount.

A light emitting element which is a component of a light emitting device of the present invention emits light by applying forward bias. A pixel of a display device formed by using a light emitting element can be driven by active matrix. Anyway, the each pixel is made to emit light by applying forward bias at a certain particular timing; however, each the pixel is in a non emission state for a certain period. Reverse bias is applied to each the pixel for the non emission period; and thus, the reliability of the light emitting element can be enhanced. A light emitting element has deterioration of emission intensity which is lowered under fixed driving condition or deterioration mode of luminance that is apparently lowered due to expansion of a non emitting region in the pixel. However, the progress of deterioration can be slower by an alternative driving of applying forward and reverse bias; and thus, the reliability of the light emitting device can be enhanced.

Further, the structure as described above is not limited to the light emitting device of the present invention shown in FIG. 1, but may be applied to the light emitting device of the present invention shown in FIGS. 6B, 7, or the like.

EMBODIMENT 2

In this embodiment, a circuit provided for a pixel portion so as to drive a light emitting element in a light emitting device of the present invention is described. However, a circuit for driving a light emitting device is not limited to that shown in this embodiment.

Figure 13:
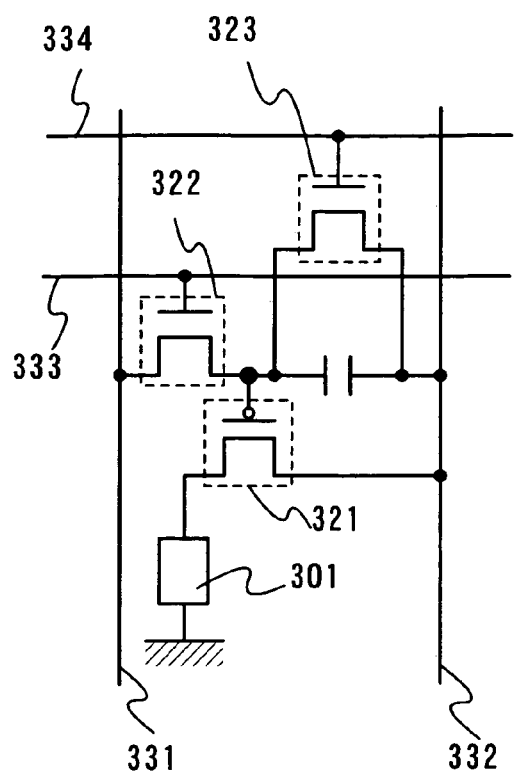
FIG. 13 is an explanatory diagram of a circuit for operating a light emitting device according to the present invention.

As shown in FIG. 13, a light emitting element 301 is connected to a circuit for driving respective light emitting elements. The circuit respectively includes a driving transistor 321 which determines an emission state or a non emission state of the light emitting element 301 by a video signal, a switching transistor 322 which controls an input of the video signal, and an erasing transistor 323 which makes the light emitting element 301 non emission state regardless of the video signal. Here, a source (or a drain) of the switching transistor 322 is connected to a source signal line 331, a source of the driving transistor 321 and a source of the erasing transistor 323 are connected to a current supply line 332 which extends parallel with the source signal line 331, a gate of the switching transistor 322 is connected to a first scanning line 333, and a gate of the erasing transistor 323 is connected to a second scanning line 334 which extends parallel with the first scanning line 333. In addition, the driving transistor 321 and the light emitting element 301 are connected to each other in series.

A driving method when the light emitting element 301 emits light is described. As soon as the first scanning line 333 is selected in a writing period, the switching transistor 322 in which the gate thereof is connected to the first scanning line 333 turns ON. Next, the video signal inputted to the source signal line 331 is inputted to a gate of the driving transistor 321 through the switching transistor 322; and thus, current flows from the current supply line 332 toward the light emitting element 301 to emit light, for example, green light. At this time, luminance of light is determined depending on the amount of current which flows toward the light emitting element 301.

Further, the light emitting element 301 corresponds to the light emitting element 25 in FIG. 1, and the driving transistor 321 corresponds to the transistor 17 in FIG. 1. The erasing transistor 323 corresponds to the transistor 28 in FIG. 2, and the switching transistor 322 corresponds to the transistor 27. Moreover, the source signal line 331 corresponds to the wiring 20c in FIG. 2, the current supply line 332 corresponds to the wiring 20b in FIG. 2, the first scanning line 333 corresponds to the wiring 29a in FIG. 2, and the second scanning line 334 corresponds to the wiring 29b in FIG. 2.

Moreover, a structure of a circuit connected to each light emitting element is not limited to that described in this embodiment, but may have different structure from the above.

Figure 14:
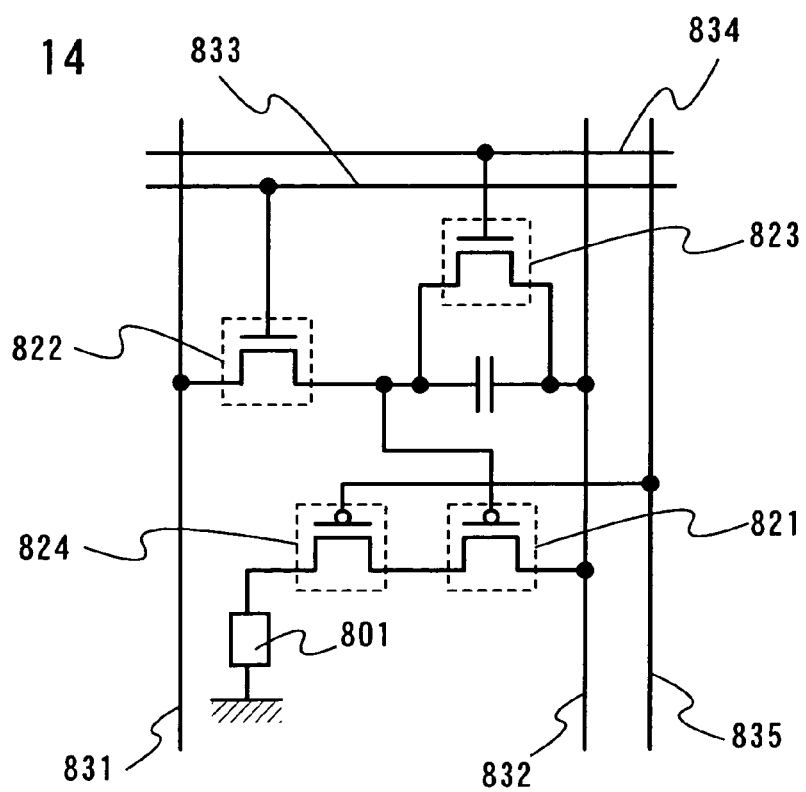
FIG. 14 is an explanatory diagram of a circuit for operating a light emitting device according to the present invention.

Next, a circuit shown in FIG. 14 is described.

As shown in FIG. 14, a light emitting element 801 is connected to a circuit for driving respective light emitting elements. The circuit includes a driving transistor 821 which determines an emission state or a non emission state of the light emitting element 801 by a video signal, a switching transistor 822 which controls an input of the video signal, an erasing transistor 823 which makes the light emitting element 801 non emission state regardless of the video signal, and a current control transistor 824 for controlling the amount of current which is supplied to the light emitting element 801. Here, a source (or a drain) of the switching transistor 822 is connected to a source signal line 831, a source of the driving transistor 821 and a source of the erasing transistor 823 are connected to a current supply line 832 which extends parallel with the source signal line 831, a gate of the switching transistor 822 is connected to a first scanning line 833, and a gate of the erasing transistor 823 is connected to a second scanning line 834 which extends parallel with the first scanning line 833. In addition, the driving transistor 821 and the light emitting element 801 are connected to each other in series interposing the current control transistor 824 therebetween. A gate of the current control transistor 824 is connected to a power supply line 835. Further, the current control transistor 824 is constituted and controlled so that current flows in a saturated region of voltage-current (Vd-Id) characteristics. Accordingly, the amount of a current value which flows through the current control transistor 824 can be determined.

A driving method when the light emitting element 801 emits light is described. As soon as the first scanning line 833 is selected in a writing period, the switching transistor 822 in which the gate thereof is connected to the first scanning line 833 turns ON. Next, the video signal inputted to the source signal line 831 is inputted to a gate of the driving transistor 821 through the switching transistor 822. Then, current flows from the current supply line 832 toward the light emitting element 801 through the driving transistor 821 and the current control transistor 824 which is made to turn ON by a signal from the power supply line 835, and then, light is emitted. At this time, the amount of the current which flows toward the light emitting element is determined depending on the current control transistor 824.

EMBODIMENT 3

In a light emitting device of the present invention, light can be sufficiently extracted from a light emitting layer to the outside. Therefore, power consumption related to a display function is lowered in an electric appliance in which the present invention is mounted. Moreover, the variation of an emission spectrum depending on the angle of viewing a light extraction surface is small; therefore, an image having favorable visibility can be obtained in an electric appliance in which the present invention is mounted. Hereinafter, an electric appliance or the like in which the present invention is mounted is described.

The light emitting device of the present invention is mounted in various electric appliances after being attached to an external input terminal to be sealed.

In this embodiment, a light emitting device of the present invention after being sealed and an electric appliance in which the light emitting device thereof is mounted are described with reference to FIGS. 15 to 17C. However, FIGS. 15 to 17C show only one embodiment; and therefore, a structure of the light emitting device is not limited to this.

In this embodiment, a method for manufacturing the light emitting device of the present invention is described with reference to FIGS. 15 and 16. Note that FIG. 16 is a cross-sectional view of FIG. 15.

Figure 15:
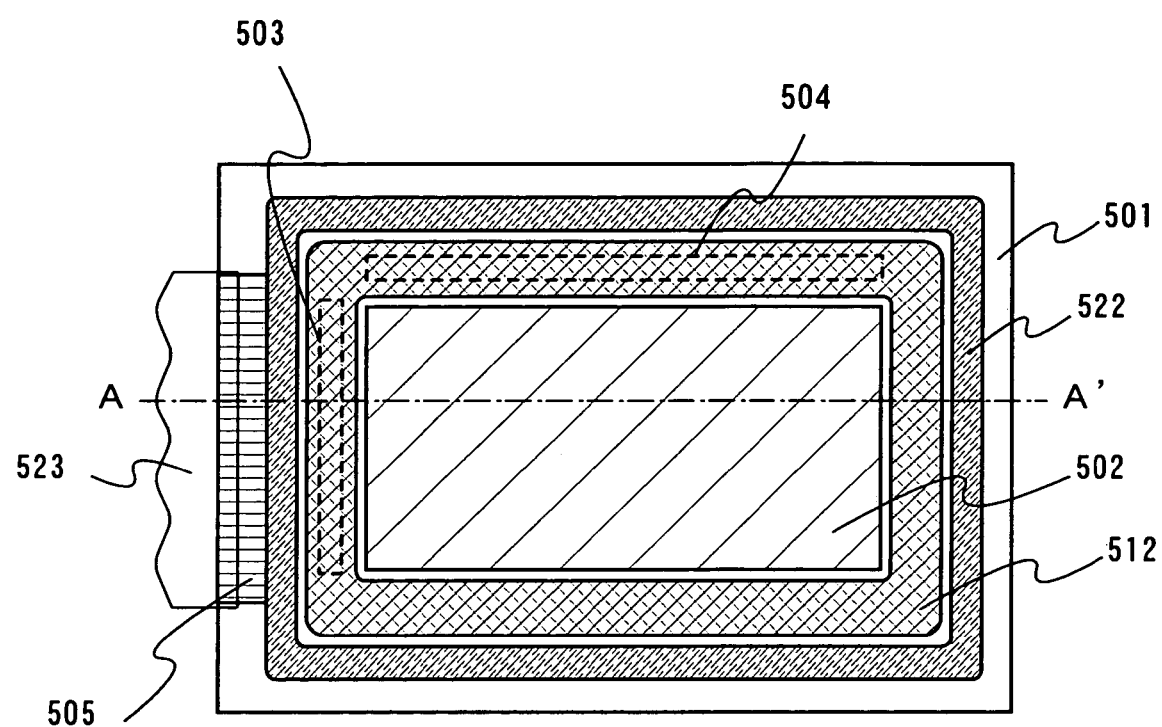
FIG. 15 is an explanatory view of a light emitting device according to the present invention after being sealed.
Figure 16:
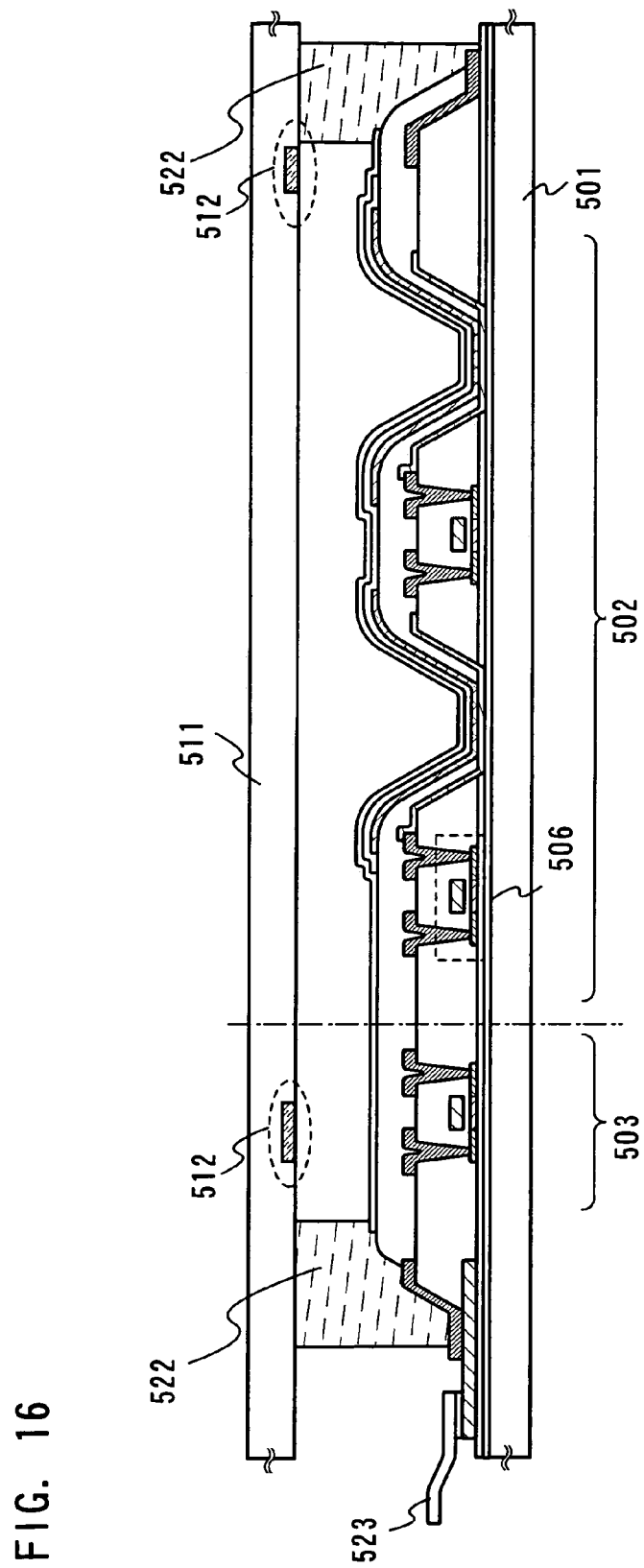
FIG. 16 is an explanatory view of a light emitting device according to the present invention after being sealed.

In FIG. 15, a pixel portion 502, a driver circuit portion 503 and a transistor 506 provided in the pixel portion, and a connection terminal portion 505 are provided over a first substrate 501 formed from glass. The driver circuit portion 503 is placed along one edge of the pixel portion 502. The connection terminal portion is provided adjacent to the driver circuit portion 503 and is connected to the driver circuit portion 503 by a wiring. Further, a glass substrate is used as the first substrate 501 in this embodiment, but besides, a quartz substrate or a substrate having flexibility such as plastic may be used.

In the pixel portion 502, a light emitting element and a circuit element (a unit for each portion such as a transistor, a resistor, and the like) for driving the light emitting element are provided. FIG. 16 schematically shows a cross-sectional structure of the first substrate 501. The present invention is applied to the pixel portion 502.

A substance having water absorption is fixed to a second substrate 511 provided to face the first substrate 501. As shown in FIG. 15, a region 512 to which A substance having water absorption is fixed is provided outside the pixel portion 502 along a terminal portion of the pixel portion 502. Moreover, the region 512 is overlapped with the driver circuit portion 503 and the transistor 506 in FIG. 15. Further, in this embodiment, granular calcium oxide is used as a substance having water absorption. In addition, a depression is provided in a part of the second substrate 511 to fix calcium oxide to the depression by using ester acrylate as a fixing agent.

Further, a glass substrate is used as the second substrate 511 in this embodiment, but besides, a quartz substrate or a substrate having flexibility such as plastic may be used. In addition, a substance having high moisture permeability other than ester acrylate may be used as the fixing agent. An inorganic substance such as siloxane other than resin may be used as the fixing agent. Moreover, the fixing agent is solidified by heating in this embodiment. However, without being limited to this, a substance including polymerization initiator and having photo-curing properties and high moisture permeability can be used as the fixing agent. In this embodiment, granular calcium oxide is used as a substance having water absorption, but other substance having water absorption may be used. In addition, a composition, which is prepared by mixing a molecule having an ability to adsorb water by chemical adsorption mixed into an organic solvent, and which is injected into the depression, then solidified, may be used.

The first substrate 501 and the second substrate 511 are bonded to each other with a sealing member 522 so that the light emitting element and the transistor or the like are sealed inside. In addition, a flexible printed circuit (FPC) 523 is connected to the circuit such as the driver circuit portion 503 through the connection terminal portion 505.

Further, a space (inside the light emitting device) surrounded by the first substrate 501, the second substrate 511, and the sealing member 522 is filled with an inert gas such as nitrogen.

In the light emitting device of the present invention as described above, an object which interferes the extraction of light from the pixel portion 502 to the outside does not exist; and therefore, the light emitting device of the present invention is effective in the case where light is extracted from a second electrode of the light emitting element (an electrode provided in the opposite side of the substrate; in other words, the light emitting layer is interposed between the electrode and the substrate). Moreover, a substance having water absorption is fixed to the inside of the region 512; therefore, a substance having water absorption is not in contact with the driver circuit portion 503 and transistor 506 even if the first substrate 501 and the second substrate 511 are pressed to bond to each other; and thus, the driver circuit portion 503 and transistor 506 are prevented from being damaged by the substance having water absorption.

Figure 17A:
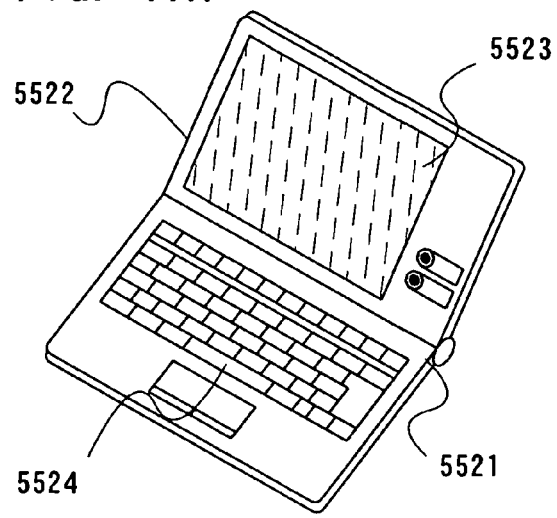
FIGS. 17A to 17C are explanatory views of an electric appliance to which the present invention is applied.
Figure 17B:
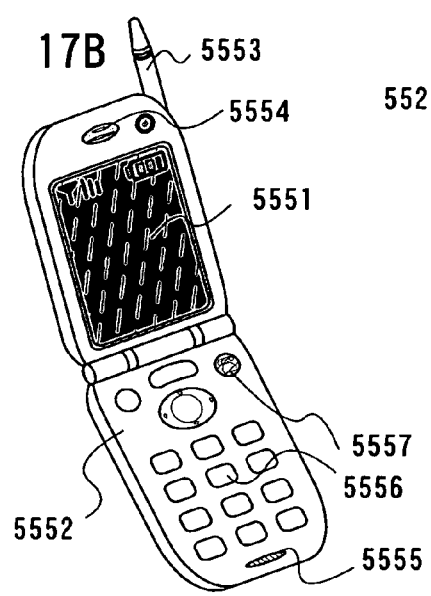
Figure 17C:
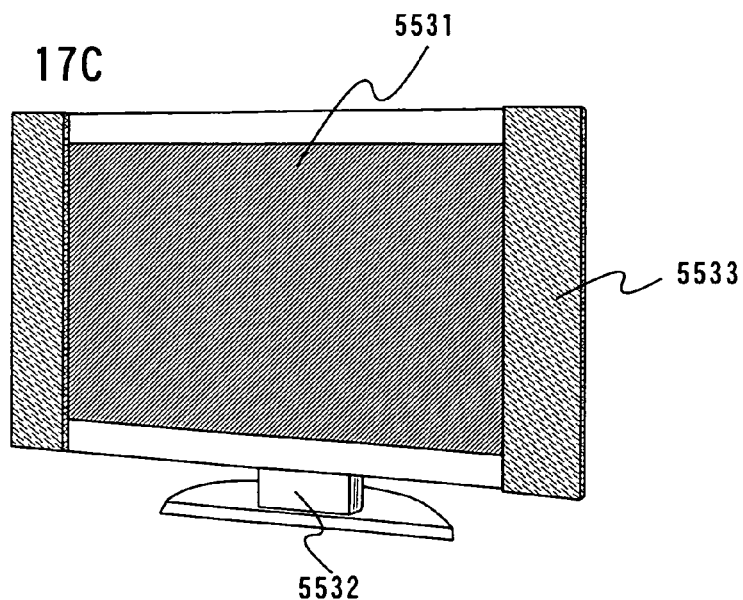

FIGS. 17A to 17C show one embodiment of an electric appliance mounted with the light emitting device according to the present invention.

FIG. 17A shows a personal computer manufactured by applying the present invention. The personal computer includes a main body 5521, a casing 5522, a display portion 5523, a keyboard 5524, and the like. The personal computer can be completed by incorporating the light emitting device of the present invention as a display portion.

FIG. 17B shows a cellular phone manufactured by applying the present invention. In a main body 5552, a display portion 5551, an audio output portion 5554, an audio input portion 5555, operation switches 5556 and 5557, an antenna 5553, and the like are provided. The cellular phone can be completed by incorporating the light emitting device of the present invention as a display portion.

FIG. 17C is a television set manufactured by applying the present invention. The television set includes a display portion 5531, a casing 5532, a speaker 5533, and the like. The television set can be completed by incorporating the light emitting device of the present invention as a display portion.

As described above, the light emitting device of the present invention is much suitable to use as a display portion of various electric appliances.

Note that the personal computer or the like is described in this embodiment, but besides, the light emitting device having a light emitting element of the present invention may be mounted with a car navigation system, a lightning system, or the like.

This application is based on Japanese Patent Application serial no. 2004-017534 field in Japan Patent Office on Jan. 26, 2004, the contents of which are hereby incorporated by reference.

What is claimed is:

1. A light emitting device comprising:
   a substrate;
   a first insulating layer provided over the substrate;
   a transistor provided over the first insulating layer;
   a second insulating layer having a first opening portion which is provided to expose the first insulating layer as well as covering the transistor;
   a first electrode provided to be overlapped with the first insulating layer in the first opening portion;
   a bank layer having a second opening portion which is provided to expose the first electrode as well as covering the second insulating layer;
   a light emitting layer provided to be overlapped with the first electrode in the second opening portion; and
   a second electrode provided to be overlapped with the light emitting layer in the second opening portion,
   wherein the first insulating layer prevents the diffusion of impurities and has a refractive index which is smaller than that of the first electrode and a refractive index which is larger than that of the substrate.

2. The light emitting device according to claim 1,
   wherein a third insulating layer having a refractive index which is smaller than that of the first electrode and which is equal to or smaller than that of the first insulating layer is provided between the first insulating layer and the first electrode.

3. The light emitting device according to claim 2,
wherein a side wall of the second insulating layer is covered with the third insulating layer.

4. A light emitting device comprising:
a substrate;
a first insulating layer provided over the substrate;
a transistor provided over the first insulating layer;
a second insulating layer having a first opening portion as well as covering the transistor;
a first electrode having a bottom surface in a bottom of the first opening portion;
a bank layer having a second opening portion as well as covering the second insulating layer;
a light emitting layer provided to be overlapped with the first electrode in the second opening portion; and
a second electrode provided to be overlapped with the light emitting layer in the second opening portion,
wherein the first insulating layer including nitride silicon containing oxygen, and
wherein the bottom surface of the first electrode overlaps with the first insulating layer.

5. The light emitting device according to claim 4,
wherein a third insulating layer having a refractive index which is smaller than that of the first electrode and which is equal to or smaller than that of the first insulating layer is provided between the first insulating layer and the first electrode.

6. The light emitting device according to claim 5,
wherein a side wall of the second insulating layer is covered with the third insulating layer.

7. A light emitting device comprising:
a substrate;
a first insulating layer provided over the substrate;
a transistor provided over the first insulating layer;
a light emitting element formed by interposing a light emitting layer between a first electrode and a second electrode;
a second insulating layer having a first opening portion which is provided to expose the first insulating layer as well as covering the transistor; and
a bank layer having a second opening portion which is provided inside the first opening portion as well as covering the second insulating layer;
wherein the first insulating layer can prevent diffusion of impurities and has a refractive index which is smaller than that of the first electrode and a refractive index which is larger than that of the substrate; and
wherein the light emitting element is provided so that the first insulating layer is overlapped with the first electrode inside the second opening portion.

8. The light emitting device according to claim 7,
wherein a third insulating layer is provided between the first insulating layer and the transistor.

9. The light emitting device according to claim 8,
wherein the third insulating layer is a layer including silicon nitride.

10. A light emitting device comprising:
a substrate;
a first insulating layer provided over the substrate;
a light emitting element formed by interposing a light emitting layer between a first electrode and a second electrode;
a second insulating layer having a first opening portion which is provided to expose the first insulating layer as well as covering the transistor,
a bank layer having a second opening portion which is provided inside the first opening portion as well as covering the second insulating layer;
wherein the first insulating layer including silicon nitride containing oxygen;
wherein the light emitting element is provided so that the first insulating layer is overlapped with the first electrode inside the second opening portion.

11. The light emitting device according to claim 10,
wherein a third insulating layer is provided between the first insulating layer and the transistor.

12. The light emitting device according to claim 11,
wherein the third insulating layer is a layer including silicon oxide.

13. A light emitting device comprising:
a substrate;
a first insulating layer provided over the substrate;
a transistor provided over the first insulating layer;
a light emitting element formed by interposing a light emitting layer between a first electrode and a second electrode;
a second insulating layer having a first opening portion which is provided to expose the first insulating layer as well as covering the transistor;
a third insulating layer which covers the second insulating layer and the first insulating layer exposed to the first opening portion; and
a bank layer having a second opening portion which is provided inside the first opening portion as well as covering the third insulating layer;
wherein the first insulating layer can prevent diffusion of impurities, and has a refractive index which is smaller than that of the first electrode and a refractive index which is larger than that of the substrate, and
wherein the light emitting element is provided so that the third insulating layer is overlapped with the first electrode inside the second opening portion.

14. The light emitting device according to claim 13,
wherein a fourth insulating layer is provided between the first insulating layer and the transistor.

15. The light emitting device according to claim 14,
wherein the fourth insulating layer is a layer including silicon oxide.

16. A light emitting device comprising:
a substrate;
a first insulating layer provided over the substrate;
a transistor provided over the first insulating layer;
a light emitting element formed by interposing a light emitting layer between a first electrode and a second electrode;
a second insulating layer having a first opening portion which is provided to expose the first insulating layer as well as covering the transistor;
a third insulating layer which covers the second insulating layer and the first insulating layer exposed to the first opening portion; and
a bank layer having a second opening portion which is provided inside the first opening portion as well as covering the third insulating layer;
wherein, the first insulating layer including silicon nitride containing oxygen; and
wherein the light emitting element is provided so that the third insulating layer is overlapped with the first electrode inside the second opening portion.

17. The light emitting device according to claim 16,
wherein a fourth insulating layer is provided between the first insulating layer and the transistor.

18. The light emitting device according to claim 17, wherein a fourth insulating layer including silicon oxide.

19. The light emitting device according to claim 1, wherein the light emitting device is applied to an electric appliance selected from the group consisting of a personal computer, a cellular phone, a television set, a car navigation system, and a lightning system.

20. The light emitting device according to claim 4, wherein the light emitting device is applied to an electric appliance selected from the group consisting of a personal computer, a cellular phone, a television set, a car navigation system, and a lightning system.

21. The light emitting device according to claim 7, wherein the light emitting device is applied to an electric appliance selected from the group consisting of a personal computer, a cellular phone, a television set, a car navigation system, and a lightning system.

22. The light emitting device according to claim 10, wherein the light emitting device is applied to an electric appliance selected from the group consisting of a personal computer, a cellular phone, a television set, a car navigation system, and a lightning system.

23. The light emitting device according to claim 13, wherein the light emitting device is applied to an electric appliance selected from the group consisting of a personal computer, a cellular phone, a television set, a car navigation system, and a lightning system.

24. The light emitting device according to claim 16, wherein the light emitting device is applied to an electric appliance selected from the group consisting of a personal computer, a cellular phone, a television set, a car navigation system, and a lightning system.

25. The light emitting device according to claim 4, wherein the first insulating layer contacts with the bottom surface of the first electrode in the bottom of the first opening portion.

* * * * *